(12) United States Patent
Lee et al.

(10) Patent No.: US 12,014,769 B2
(45) Date of Patent: Jun. 18, 2024

(54) VOLATILE MEMORY DEVICE

(71) Applicant: SAMSUNG ELECTRONICS CO., LTD., Suwon-si (KR)

(72) Inventors: Jae Pil Lee, Seoul (KR); Hi Jung Kim, Hwaseong-si (KR); Kwang Sook Noh, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 147 days.

(21) Appl. No.: 17/876,046

(22) Filed: Jul. 28, 2022

(65) Prior Publication Data

US 2023/0144366 A1 May 11, 2023

(30) Foreign Application Priority Data

Nov. 9, 2021 (KR) .................. 10-2021-0153215
Jan. 18, 2022 (KR) .................. 10-2022-0007254

(51) Int. Cl.
*G11C 11/4091* (2006.01)
*G11C 11/4094* (2006.01)
*G11C 11/4096* (2006.01)
*G11C 11/4099* (2006.01)

(52) U.S. Cl.
CPC ...... *G11C 11/4091* (2013.01); *G11C 11/4094* (2013.01); *G11C 11/4096* (2013.01); *G11C 11/4099* (2013.01)

(58) Field of Classification Search
CPC ............ G11C 11/4091; G11C 11/4094; G11C 11/4096; G11C 11/4099
See application file for complete search history.

(56) References Cited

U.S. PATENT DOCUMENTS

| | | | |
|---|---|---|---|
| 6,898,109 B2 * | 5/2005 | Hirose | H10B 12/50 257/E21.656 |
| 7,542,362 B2 | 6/2009 | Versen et al. | |
| 7,649,760 B2 | 1/2010 | Hong et al. | |
| 8,482,951 B2 | 7/2013 | Yi et al. | |
| 8,976,563 B2 * | 3/2015 | Iida | G11C 5/06 365/72 |
| 9,396,776 B2 | 7/2016 | Yang | |
| 9,570,150 B2 | 2/2017 | Kim | |
| 10,643,687 B2 | 5/2020 | Na | |

\* cited by examiner

*Primary Examiner* — Son L Mai
(74) *Attorney, Agent, or Firm* — Fish & Richardson P.C.

(57) ABSTRACT

A volatile memory device may include; a first sense amplifier, a second sense amplifier spaced apart from the first sense amplifier in a first direction, a first mat disposed between the first sense amplifier and the second sense amplifier and including a first bit line connected to the first sense amplifier and a second bit line connected to the second sense amplifier, a third sense amplifier spaced apart from the second sense amplifier in a second direction, a fourth sense amplifier spaced apart from the third sense amplifier in the first direction, and a second mat disposed between the third sense amplifier and the fourth sense amplifier and including a first complementary bit line connected to the first sense amplifier.

20 Claims, 18 Drawing Sheets

REG2

VOLATILE MEMORY DEVICE

This application claims priority under 35 U.S.C. § 119 from Korean Patent Application No. 10-2021-0153215 filed on Nov. 9, 2021, and Korean Patent Application No. 10-2022-0007254 filed on Jan. 18, 2022, the subject matter of which is hereby incorporated by reference in its entirety.

BACKGROUND

1. Field of the Disclosure

The present disclosure relates generally to volatile memory devices. More particularly, the present disclosure relates to volatile memory devices having an open bit line structure.

2. Description of the Related Art

Semiconductor memory devices may be generally categorized as volatile memory devices and non-volatile memory devices. Volatile memory devices (e.g., dynamic random access memory (RAM) (DRAM)) store data by charging/discharging of a constituent cell capacitor. Volatile memory devices provide relatively fast data access speeds, and are commonly used as components in computer memory systems. However, volatile memory devices lose stored data in the absence of applied power. In contrast, non-volatile memory devices are able to retain stored data in the absence of applied power. Non-volatile memory devices also provide very large data storage capacity. Accordingly, non-volatile memory devices are primarily used to implement large-capacity (or bulk) memory systems able to store program data, application data, and/or user data.

Volatile memory devices may be further categorized as having an open bit line structure or a folded bit line structure. A sense amplifier of the volatile memory device with the aforementioned structures may have a pair of bit lines corresponding to each other. However, volatile memory devices having the open bit line structure may have unnecessary mats according to particular characteristics of the structure.

SUMMARY

Aspects of the present disclosure provide volatile memory devices having a reduced area.

Aspects of the present disclosure provide also provide volatile memory devices capable of being more densely integrated.

Aspects of the present disclosure are not limited to those mentioned above, and additional objects of the present disclosure will be appreciated by those skilled in the art upon consideration of the following detailed description and accompanying drawings.

According to an aspect of the present disclosure, a volatile memory device may include; a first sense amplifier, a second sense amplifier spaced apart from the first sense amplifier in a first direction, a first mat disposed between the first sense amplifier and the second sense amplifier and including a first bit line connected to the first sense amplifier and a second bit line connected to the second sense amplifier, a third sense amplifier spaced apart from the second sense amplifier in a second direction, a fourth sense amplifier spaced apart from the third sense amplifier in the first direction, and a second mat disposed between the third sense amplifier and the fourth sense amplifier and including a first complementary bit line connected to the first sense amplifier.

According to an aspect of the present disclosure, a volatile memory device may include; a row decoder extending in a first direction, a column decoder extending in a second direction, and a memory cell array between the row decoder and the column decoder. The memory cell may include; a center region including a first sense amplifier, a first mat including a first bit line connected to the first sense amplifier, and a second mat including a first complementary bit line connected to the first sense amplifier, and a first edge region disposed in the first direction from the center region, wherein the first edge region includes a second sense amplifier and a third mat including a second bit line connected to the second sense amplifier and disposed in a third direction opposite to the first direction from the second sense amplifier, and the second sense amplifier is connected to the first complementary bit line of the center region.

According to an aspect of the present disclosure, a volatile memory device may include; a first sense amplifier, a second sense amplifier spaced apart from the first sense amplifier in a first direction, a third sense amplifier spaced apart from the first sense amplifier in the first direction and spaced apart from the second sense amplifier in a second direction, a first mat formed between the first sense amplifier and the second sense amplifier and including a first bit line connected to the first sense amplifier and a second bit line connected to the second sense amplifier, a second mat formed between the first sense amplifier and the third sense amplifier and including a first complementary bit line connected to the first sense amplifier and a third bit line connected to the third sense amplifier, a third mat spaced apart from the second sense amplifier in the first direction and including a second complementary bit line connected to the second sense amplifier, a fourth mat spaced apart from the third sense amplifier in the first direction and including a third complementary bit line connected to the third sense amplifier, a first word line connected to the first mat and the fourth mat, and a second word line connected to the second mat and the third mat.

BRIEF DESCRIPTION OF THE DRAWINGS

Advantages, benefits, and features, as well as the making and use of embodiments consistent with the present disclosure will become more apparent upon consideration of the following detail description together with the accompanying drawings, in which.

DETAILED DESCRIPTION

Hereinafter, certain embodiments according to the present disclosure will be described with reference to the accompanying drawings.

Figure 1:
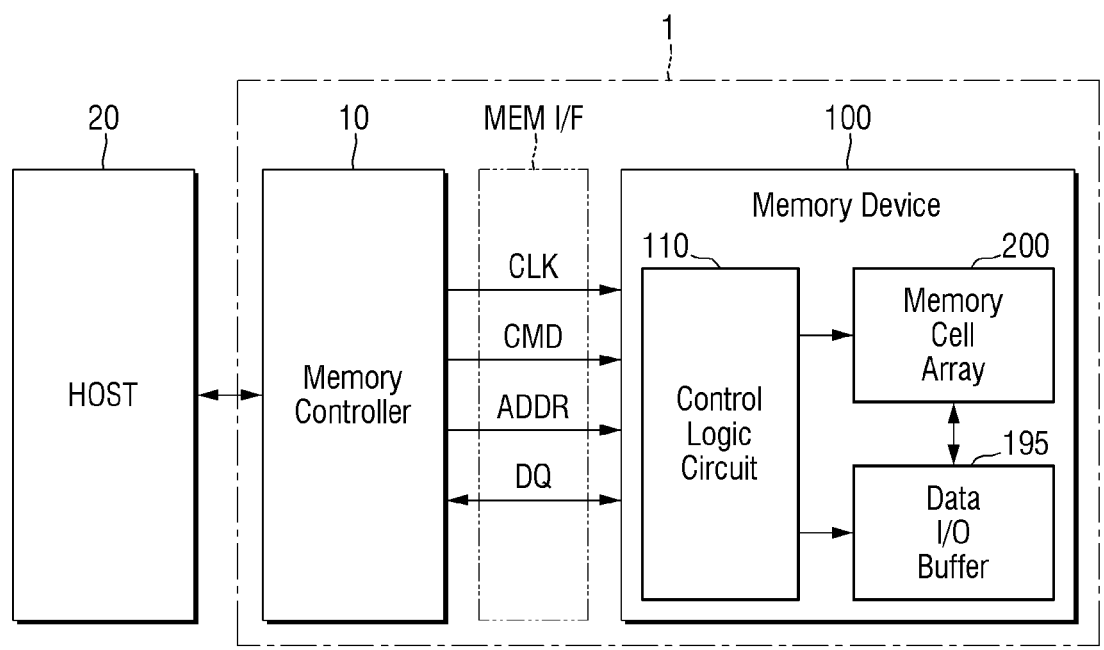
FIG. 1 is a block diagram illustrating a memory system according to embodiments.

Figure (FIG. 1 is a block diagram illustrating a memory system according to embodiments.

Referring to FIG. 1, the memory system may generally include a host device 20 and a memory storage device 1, wherein the memory storage device 1 may include a memory device 100 and a memory controller 10.

The memory controller 10 may control the overall operation of the memory device 100. In this regard, the memory controller 10 may control data communication (e.g., transmission and/or receipt of data) between the external host device 20 and the memory device 100. That is, the memory controller 10 may control the memory device 100 in performing various operations (e.g., a write (or program) operation, a read operation, an erases operation, etc.) responsive to one or more request(s) received from the host device 20 (e.g., a write (or program) request, a read request, or an erase request).

Within the memory storage device 1, the memory controller 10 and the memory device 100 may communication through a memory interface MEM I/F. In similar vein, the memory controller 10 may communicate with the external host device 20 through a host interface (not shown). Accordingly, the memory controller 10 may communicate a variety of external signals between the memory device 100 and the host device 20, and may further communicate a variety of internal signals (e.g., command/control signals CMD, address signals ADDR, clock signals CLK, and data signals DQ) to control operation of the memory device 100.

In some embodiments, the memory device 100 may include a DRAM, a Double Data Rate 4 DRAM (DDR4), a Synchronous DRAM (SDRAM), a Low Power DDR4 (LPDDR4) SRAM, a LPDDR5 SDRAM, etc. Alternately or additionally, the memory device 100 may include a non-volatile memory device. Hereafter, certain embodiments will be described under an assumption that the memory device 100 includes a volatile memory device.

Thus, the memory controller 10 may communicate a clock signal CLK, a command CMD, an address ADDR signal, etc. to the memory device 100. Further, the memory controller 10 may provide data DQ to the memory device 100 and/or receive data DQ from the memory device 100.

In some embodiments, the memory device 100 may include a memory cell array 200 for storing the data DQ, a control logic circuit 110 and a data input/output (I/O) buffer 195.

Figure 2:
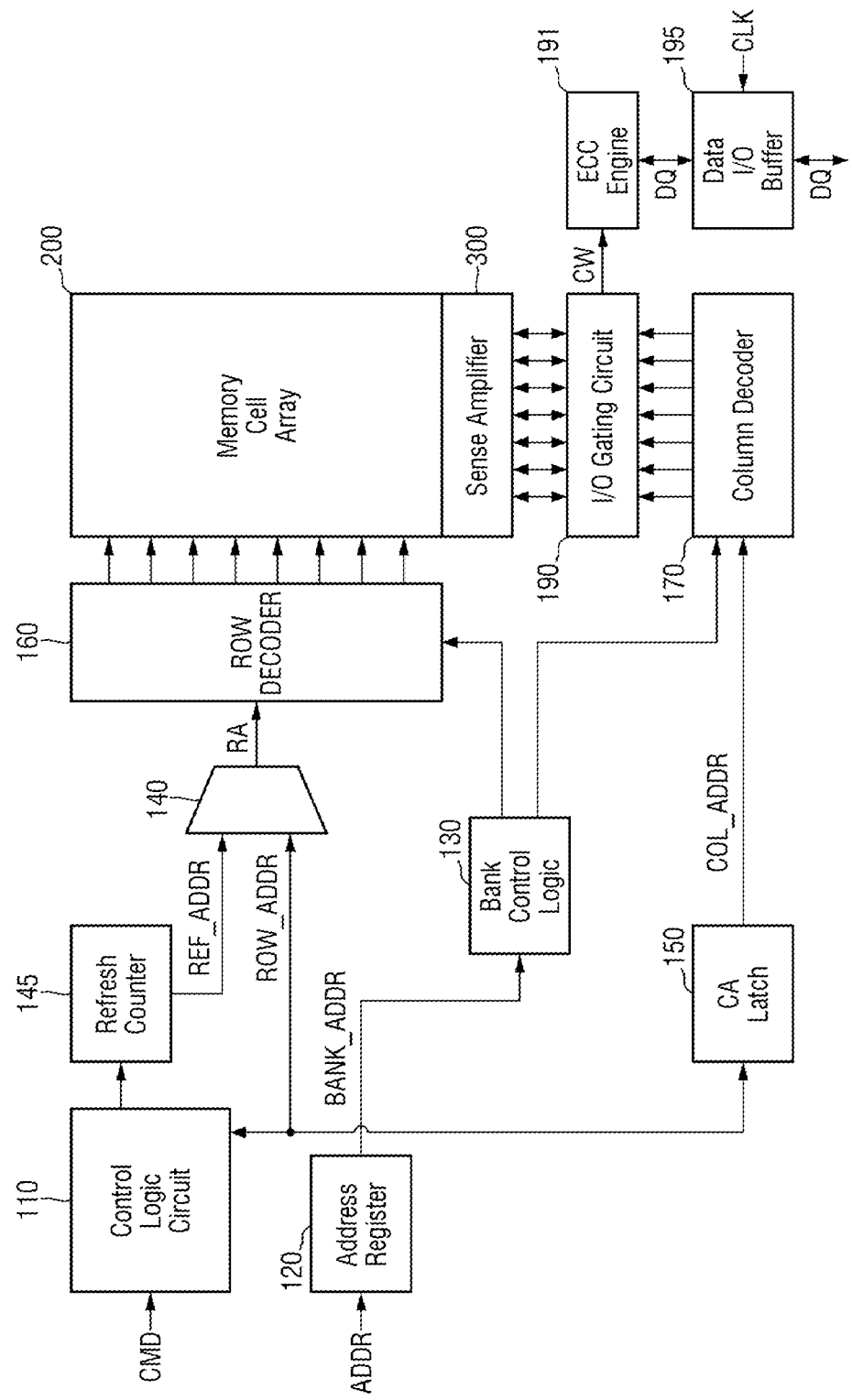
FIG. 2 is a block diagram further illustrating the memory device 100 of FIG. 1.

FIG. 2 is a block diagram further illustrating in one embodiment the memory device 100 of FIG. 1.

Referring to FIG. 2, the memory device 100 may include the control logic circuit 110, an address register 120, a bank control logic circuit 130, a row address multiplexer 140, a refresh counter 145, a column address latch 150, a row decoder 160, a column decoder 170, the memory cell array 200, a sense amplifier 300, an input/output (I/O) gating circuit 190, an ECC engine 191, the data I/O buffer 195, etc.

The memory cell array 200 may include a plurality of bank memory arrays. The row decoder 160 may be connected to the plurality of bank memory arrays. The column decoder 170 may be connected to the plurality of bank memory arrays. The sense amplifier 300 may be connected to the plurality of bank memory arrays. The memory cell array 200 may include a plurality of word lines, a plurality of bit lines and a plurality of memory cells formed at points where the word lines and the bit lines intersect.

The address register 120 may receive the address ADDR from the memory controller 10. The address ADDR may include a bank address BANK_ADDR, a row address ROW_ADDR, a column address COL_ADDR, etc. The address register 120 may provide the bank address BANK_ADDR to the bank control logic circuit 130. The address register 120 may provide the row address ROW_ADDR to the row address multiplexer 140. The address register 120 may provide the column address COL_ADDR to the column address latch 150.

The bank control logic circuit 130 may generate a bank control signal in response to the bank address BANK_ADDR. The row decoder 160 may be activated in response to the bank control signal. Further, the column decoder 170 may be activated in response to the bank control signal corresponding to the bank address BANK_ADDR.

The row address multiplexer 140 may receive the row address ROW_ADDR from the address register 120 and receive a refresh row address REF_ADDR from the refresh counter 145. The row address multiplexer 140 may select one of the row address ROW_ADDR and the refresh row address REF_ADDR to output the selected one as a row address RA. The row address RA may be transmitted to the row decoder 160.

The refresh counter 145 may sequentially output the refresh row address REF_ADDR according to the control of the control logic circuit 110.

The row decoder 160 activated by the bank control logic circuit 130 may activate a word line corresponding to the row address RA by decoding the row address RA output from the row address multiplexer 140. For example, the row decoder 160 may apply a word line driving voltage to the word line corresponding to the row address RA.

The column address latch 150 may receive the column address COL_ADDR from the address register 120 and temporarily store the received column address COL_ADDR. The column address latch 150 may gradually increase the received column address COL_ADDR in a burst mode. The column address latch 150 may provide the temporarily stored column address COL_ADDR or the gradually increased column address COL_ADDR to the column decoder 170.

Among the column decoders 170, the column decoder 170 activated by the bank control logic circuit 130 may activate the sense amplifier 300 corresponding to the bank address BANK_ADDR, and the column address COL_ADDR through the corresponding I/O gating circuit 190.

The I/O gating circuit 190 may include a circuit configured to gate I/O data, an input data mask logic, read data latches configured to store data output from the memory cell array 200, and write drivers configured to write the data to the memory cell array 200.

A codeword CW read from the bank memory array of the memory cell array 200 may be sensed by the sense amplifier 300 corresponding to the bank memory array. Further, the codeword CW may be stored in the read data latch. Further in this regard, ECC decoding may be performed on the codeword CW stored in the read data latch by the ECC engine 191, and the data DQ on which the ECC decoding is performed may be provided to the memory controller 10 through the data I/O buffer 195.

The data I/O buffer 195 may provide the data DQ to the ECC engine 191 based on the clock signal CLK in a write operation. The data I/O buffer 195 may provide the data DQ provided from the ECC engine 191 to the memory controller 10 based on the clock signal CLK in a read operation.

The memory cell array 200 may be connected to the sense amplifier 300, and the row decoder 160 and the column decoder 170 may be connected to the memory cell array 200 and the sense amplifier 300. That is, a plurality of bit lines included in the memory cell array 200 may be connected to the sense amplifier 300 in an open bit line structure. This arrangement will be described hereafter in some additional detail.

Figure 3:
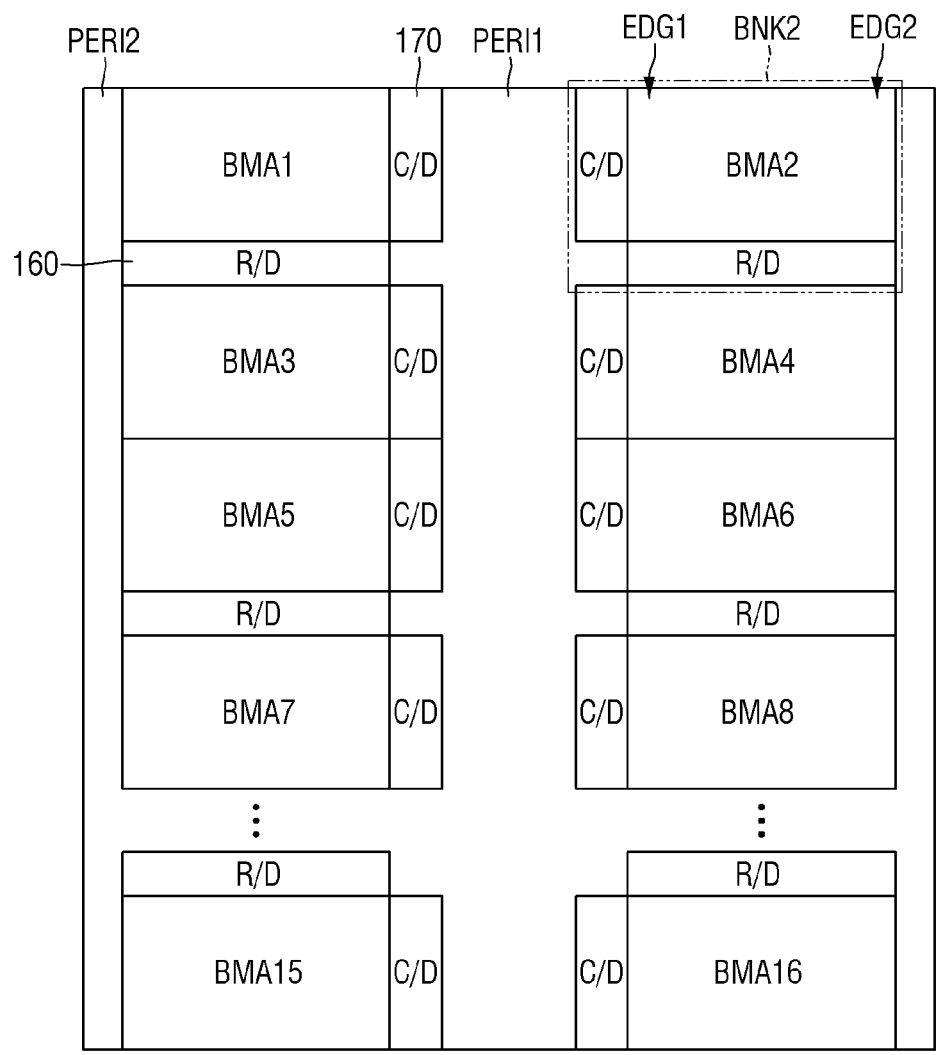
FIG. 3 is a plan (or top-down) view illustrating, in part, a memory device according to embodiments.

FIG. 3 is a plan view further illustrating, in part, a memory device according to some embodiments.

Referring to FIG. 3, the memory device 100 may include a plurality of bank memory arrays BMA1 to BMA16, the row decoder 160, the column decoder 170, a first peripheral circuit region PERI1, and a second peripheral circuit region PERI2.

In some embodiments, the memory device 100 may be disposed in a horizontal plane defined by a first horizontal direction (e.g., a first direction X) and a second horizontal direction (e.g., a second direction Y) intersecting the first direction X. That is, the memory device 100 may be understood as extending in the first direction X and the second direction Y generally between the row decoder 160 and the column decoder 170. In some embodiments, the memory device 100 may have a substantially rectangular shape.

As one example, the memory device 100 may include sixteen bank memory arrays BMA1 to BMA16, wherein the sixteen bank memory arrays BMA1 to BMA16 may be used to process 1 Gb of data. However, the embodiments of the present disclosure are not limited thereto, and the memory device 100 may include a different number of bank memory arrays. The bank memory arrays BMA1 to BMA16 may be regularly disposed. For example, first, third, fifth, seventh, ninth, eleventh, thirteenth, and fifteenth bank memory arrays BMA1, BMA3, BMA5, BMA7, BMA9, BMA11, BMA13, and BMA15 may be sequentially disposed in a direction opposite to the second direction Y, and second, fourth, sixth, eighth, tenth, twelfth, fourteenth, and sixteenth bank memory arrays BMA2, BMA4, BMA6, BMA8, BMA10, BMA12, BMA14, and BMA16 may be sequentially disposed in a direction opposite to the second direction Y. Further, the second, fourth, sixth, eighth, tenth, twelfth, fourteenth, and sixteenth bank memory arrays BMA2, BMA4, BMA6, BMA8, BMA10, BMA12, BMA14, and BMA16 may be spaced apart (e.g., separated) from the first, third, fifth, seventh, ninth, eleventh, thirteenth, and fifteenth bank memory arrays BMA1, BMA3, BMA5, BMA7, BMA9, BMA11, BMA13, and BMA15 in the first direction X.

The row decoder 160 may extend in the first direction X, and may be disposed between the plurality of bank memory arrays BMA1 to BMA16. For example, the row decoder 160 may be disposed between the first bank memory array BMA1 and the third bank memory array BMA3. The column decoder 170 may extend in the second direction Y and may be disposed at one side of each of the plurality of bank memory arrays BMA1 to BMA16. For example, the column decoder 170 may be disposed in the first direction X from the first bank memory array BMA1. Further, the row decoder 160 may intersect the column decoder 170. Further, the plurality of bank memory arrays BMA1 to BMA16 may be surrounded by the row decoder 160 and the column decoder 170. The plurality of bank memory arrays BMA1 to BMA16 may be defined by the row decoder 160 and the column decoder 170.

The first and second peripheral circuit regions PERI1 and PERI2 may be disposed in portions of the memory device 100 excluding the plurality of bank memory arrays BMA1 to BMA16, the row decoder 160, and the column decoder 170. Here, the first and second peripheral circuit regions PERI1 and PERI2 may include the control logic circuit 110, the address register 120, the bank control logic circuit 130, the row address multiplexer 140, the refresh counter 145, the column address latch 150, the I/O gating circuit 190, the ECC engine 191, and the data I/O buffer 195 of FIG. 2. The first peripheral circuit region PERI1 may be disposed between the plurality of bank memory arrays BMA1 to BMA16. The second peripheral circuit region PERI2 may be disposed outside the plurality of bank memory arrays BMA1 to BMA16. For example, the second peripheral circuit region PERI2 may extend in a third direction opposite to the first direction X from the first, third, fifth, seventh, ninth, eleventh, thirteenth, and fifteenth bank memory arrays BMA1, BMA3, BMA5, BMA7, BMA9, BMA11, BMA13, and BMA15, and extend in the first direction X from the second, fourth, sixth, eighth, tenth, twelfth, fourteenth, and sixteenth bank memory arrays BMA2, BMA4, BMA6, BMA8, BMA10, BMA12, BMA14, and BMA16.

One of the bank memory arrays BMA1 to BMA16 may include the memory cell array 200 and a part of the sense amplifier 300, however embodiments of the present disclosure is not limited thereto. One of the bank memory arrays BMA1 to BMA16 may include a first edge region EDG1 and a second edge region EDG2. For example, the second bank memory array BNK2 may include the first edge region EDG1 in a direction opposite to the first direction X and the second edge region EDG2 in the first direction X.

A memory bank may be defined by one of the bank memory arrays BMA1 to BMA16, one row decoder 160, and one column decoder 170. For example, a second memory bank BNK2 may be defined by the second bank memory array BNK2, the row decoder 160, and the column decoder 170. Here, the memory bank may correspond to a storage unit indicating one bank address.

Figure 4:
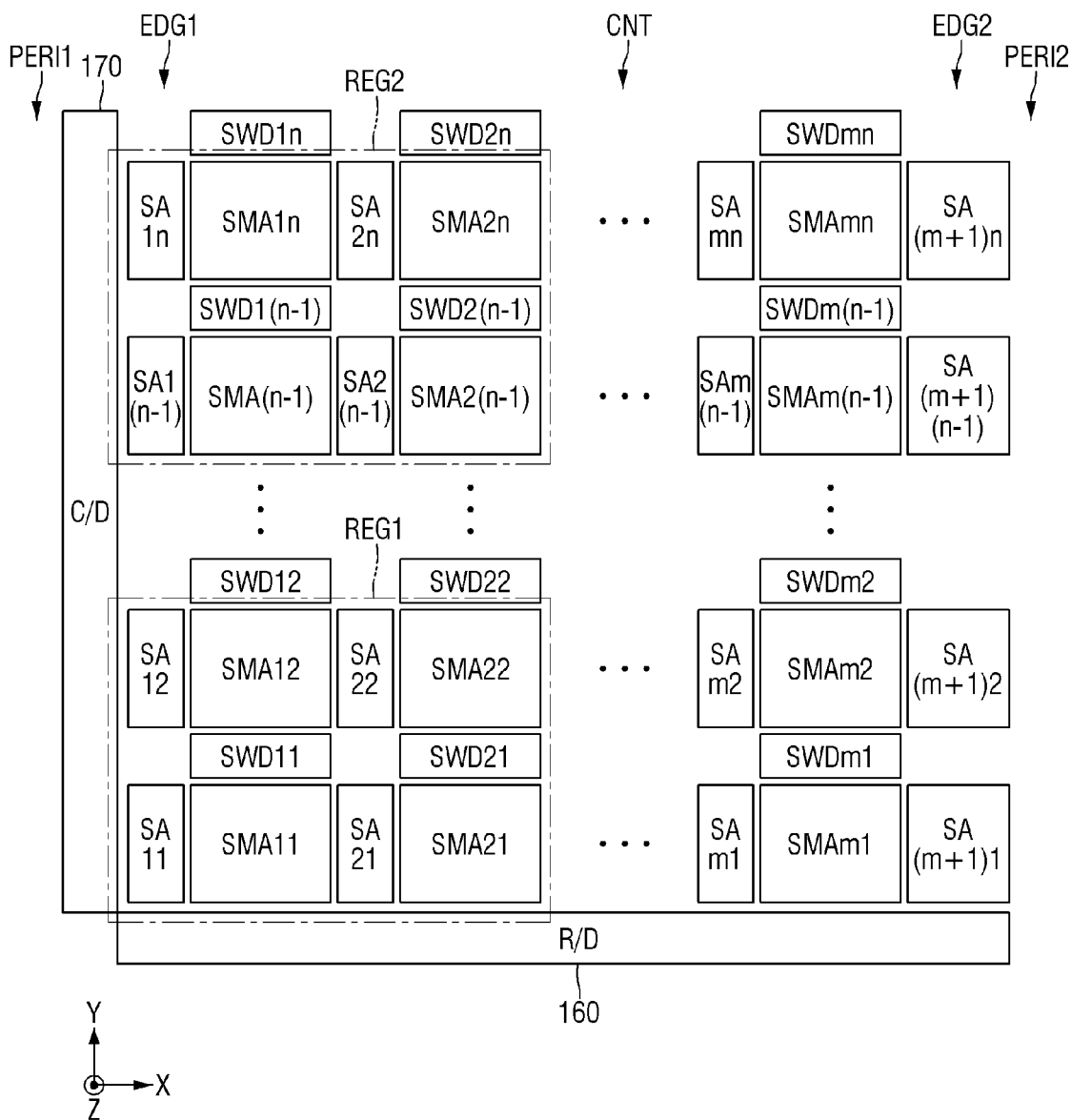
FIG. 4 is an enlarged view further illustrating the second memory bank BNK2 of FIG. 3.

FIG. 4 is an enlarged view further illustrating the second memory bank BNK2 of FIG. 3.

Referring to FIGS. 3 and 4, the second memory bank BNK2 may include the row decoder 160, the column decoder 170, wherein the second bank memory array BMA2 may be substantially surrounded by the row decoder 160 and the column decoder 170. Here, the second bank memory array BMA2 may include a plurality of sense amplifiers, a plurality of mats, and a plurality of decoders. The plurality of sense amplifiers, the plurality of mats, and the plurality of decoders may be disposed in a region defined by the row decoder 160 and the column decoder 170.

The plurality of mats may include first to nth sub memory arrays SMA11 to SMA1n, first to nth sub memory arrays SMA21 to SMA2n, first to nth sub memory arrays SMAm1 to SMAmn, etc. The first to nth sub memory arrays SMA11 to SMA1n, the first to nth sub memory arrays SMA21 to SMA2n, and the first to nth sub memory arrays SMAm1 to SMAmn may be disposed in the first direction X. For example, the first to nth sub memory arrays SMA21 to SMA2n may be disposed in the first direction X from the first to nth sub memory arrays SMA11 to SMA1n, and the first to nth sub memory arrays SMAm1 to SMAmn may be disposed in the first direction X from the first to nth sub memory arrays SMA21 to SMA2n.

The first to nth sub memory arrays SMA11 to SMA1n may be disposed in the second direction Y. For example, the second sub memory array SMA12 may be disposed in the second direction Y from the first sub memory array SMA11, and the nth sub memory array SMA1n may be disposed in the second direction Y from the (n−1)th sub memory array SMA1(n−1). Here, the first to nth sub memory arrays SMA11 to SMA1n may be disposed in the first edge region EDG1.

The first to nth sub memory arrays SMA21 to SMA2n may be disposed in the second direction Y. For example, the second sub memory array SMA22 may be disposed in the second direction Y from the first sub memory array SMA21, and the nth sub memory array SMA2n may be disposed in the second direction Y from the (n−1)th sub memory array SMA2(n−1). Here, the first to nth sub memory arrays SMA21 to SMA2n may be disposed in a center region CNT, wherein the center region CNT may correspond to a region between the first edge region EDG1 and the second edge region EDG2. For example, the center region CNT may correspond to a portion of the second bank memory array BMA2 excluding the first edge region EDG1 and the second edge region EDG2.

The first to nth sub memory arrays SMAm1 to SMAmn may be disposed in the second direction Y. For example, the second sub memory array SMAm2 may be disposed in the second direction Y from the first sub memory array SMAm1, and the nth sub memory array SMAmn may be disposed in the second direction Y from the (n−1)th sub memory array SMAm(n−1). Here, the first to nth sub memory arrays SMAm1 to SMAmn may be disposed in the second edge region EDG2.

The plurality of sense amplifiers may include first to nth sub sense amplifiers SA11 to SA1n, first to nth sub sense amplifiers SA21 to SA2n, first to nth sub sense amplifiers SAm1 to SAmn, first to nth sub sense amplifiers SA(m+1)1 to SA(m+1)n, etc. The plurality of sense amplifiers may be disposed between the plurality of mats.

The sense amplifier may read or write (hereafter, "read/write") data using a bit line and a complementary bit line included in the mat. The sense amplifier and the decoder may be driven by the row decoder 160 and the column decoder 170.

The first to nth sub sense amplifiers SA11 to SA1n may be disposed between the column decoder 170 and the first to nth sub memory arrays SMA11 to SMA1n. Here, the first to nth sub sense amplifiers SA11 to SA1n may be connected to the first to nth sub memory arrays SMA11 to SMA1n, respectively. The first to nth sub sense amplifiers SA11 to SA1n may be disposed in the first edge region EDG1.

The first to nth sub sense amplifiers SA21 to SA2n may be disposed between the first to nth sub memory arrays SMA11 to SMA1n and the first to nth sub memory arrays SMA21 to SMA2n. The first to nth sub sense amplifiers SA21 to SA2n may be connected to the first to nth sub memory arrays SMA11 to SMA1n and the first to nth sub memory arrays SMA21 to SMA2n. The first to nth sub sense amplifiers SAm1 to SAmn may be disposed in a direction opposite to the first direction X from the first to nth sub memory arrays SMAm1 to SMAmn. The first to nth sub sense amplifiers SAm1 to SAmn may be connected to the first to nth sub memory arrays SMAm1 to SMAmn, respectively. The first to nth sub sense amplifiers SA21 to SA2n and the first to nth sub sense amplifiers SAm1 to SAmn may be disposed in the center region CNT.

The first to nth sub sense amplifiers SA(m+1)1 to SA(m+1)n may be disposed between the second peripheral circuit region PERI2 and the first to nth sub memory arrays SMAm1 to SMAmn Here, the first to nth sub sense amplifiers SA(m+1)1 to SA(m+1)n may be connected to the first to nth sub memory arrays SMAm1 to SMAmn, respectively. The first to nth sub sense amplifiers SA(m+1)1 to SA(m+1)n may be disposed in the second edge region EDG2.

The plurality of decoders may include first to nth decoders SWD11 to SWD1n, first to nth decoders SWD21 to SWD2n, first to nth decoders SWDm1 to SWDmn, etc. The first to nth decoders SWD11 to SWD1n may be connected to the first to nth sub memory arrays SMA11 to SMA1n, respectively, the first to nth decoders SWD21 to SWD2n may be connected to the first to nth sub memory arrays SMA21 to SMA2n, respectively, and the first to nth decoders SWDm1 to SWDmn may be connected to the first to nth sub memory arrays SMAm1 to SMAmn, respectively. The plurality of decoders may be used to drive each sub memory array.

Figure 5:
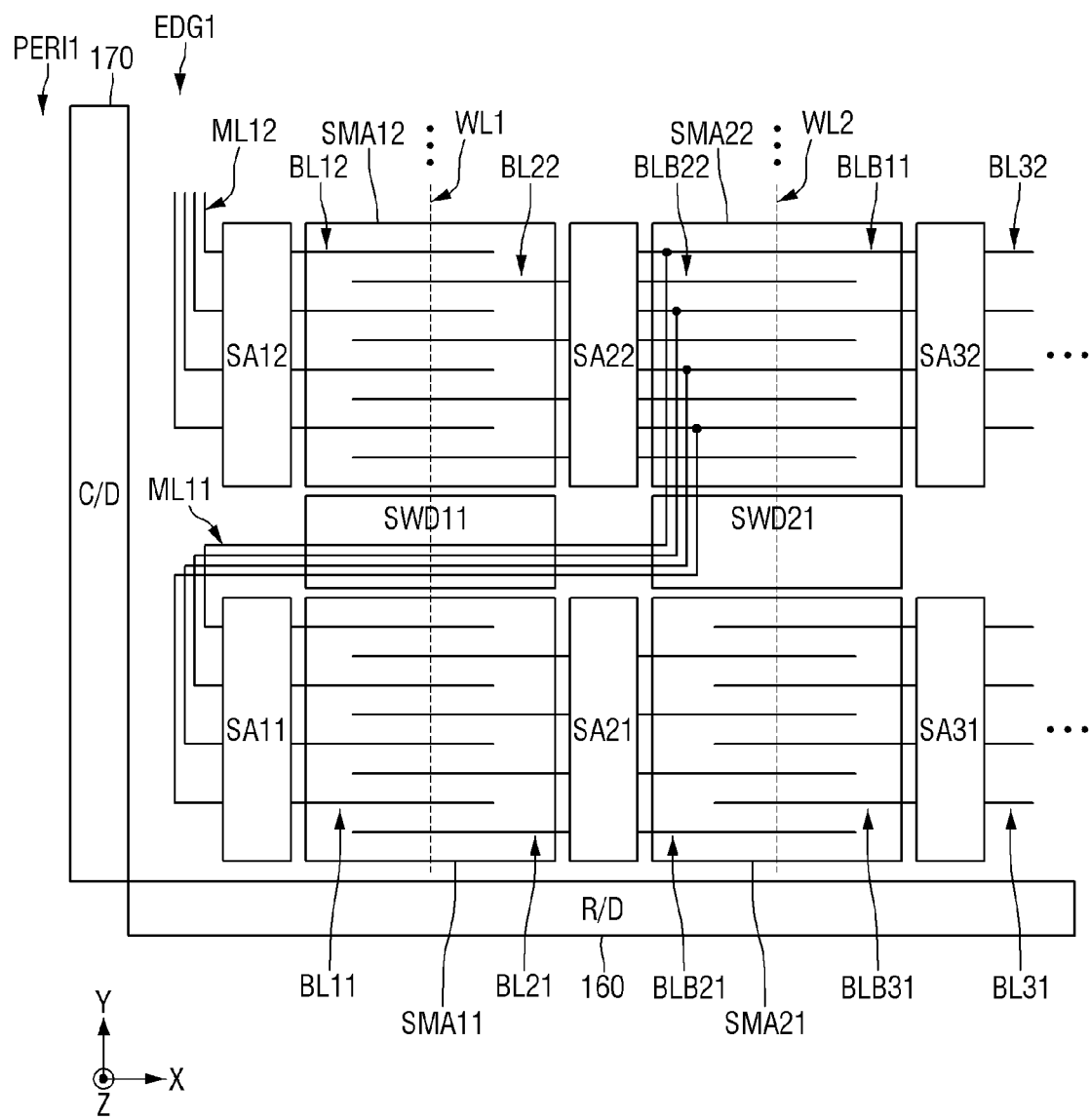
FIG. 5 is an enlarged view further illustrating the first region REG1 of FIG. 4.
Figure 6:
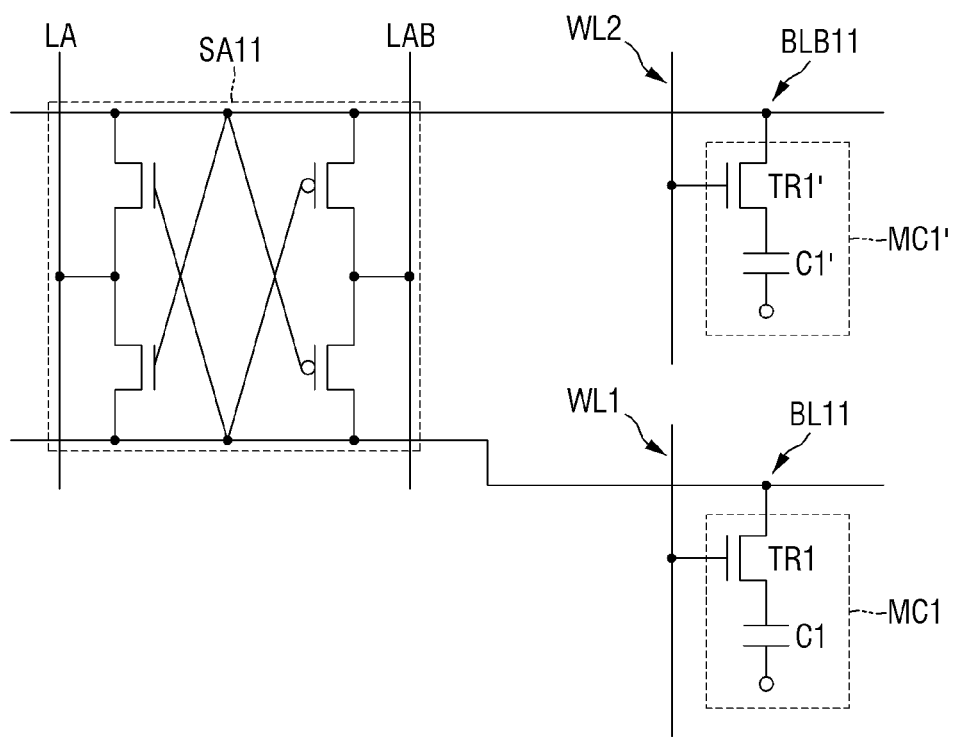
FIG. 6 is a circuit diagram illustrating a sense amplifier and a plurality of memory cells of FIG. 4.

FIG. 5 is an enlarged view further illustrating the first region REG1 of FIG. 4, and FIG. 6 is a circuit diagram illustrating the sense amplifier and the plurality of memory cells of FIG. 4.

Referring to FIG. 5, a first region REG1 of the second memory bank BNK2 may include the first sub memory array SMA11, the second sub memory array SMA12, the first sub memory array SMA21, the second sub memory array SMA22, the first sub sense amplifier SA11, the second sub sense amplifier SA12, the first sub sense amplifier SA21, the second sub sense amplifier SA22, the first sub sense amplifier SA31, and the second sub sense amplifier SA32.

The first sub sense memory array SMA11 may include a first bit line BL11 and a first bit line BL21. The first bit line BL11 and the first bit line BL21 may extend in the first direction X. The first bit line BL11 may be connected to the first sub sense amplifier SA11, and the first bit line BL21 may be connected to the first sub sense amplifier SA21. A first word line WL1 may extend in the second direction Y, and may be connected to both the first bit line BL11 and the first bit line BL21 of the first sub memory array SMA11. Further, the first word line WL1 may be connected to the first decoder SWD11.

The second sub memory array SMA12 may include a second bit line BL12 and a second bit line BL22. The second bit line BL12 and the second bit line BL22 may extend in the first direction X. The second bit line BL12 may be connected to the second sub sense amplifier SA12, and the second bit line BL22 may be connected to the second sub sense amplifier SA22. The first word line WL1 may be connected to both the second bit line BL12 and the second bit line BL22.

The first sub memory array SMA21 may include a first complementary bit line BLB21 and a first complementary bit line BLB31. The first complementary bit line BLB21 and the first complementary bit line BLB31 may extend in the first direction X. The first complementary bit line BLB21 may be connected to the first sub sense amplifier SA21 and the first complementary bit line BLB31 may be connected to the first sub sense amplifier SA31. A second word line WL2 may extend in the second direction Y and may be connected to both the first complementary bit line BLB21 and the first complementary bit line BLB31 of the first sub memory array SMA21. Further, the second word line WL2 may be connected to the first decoder SWD21.

The second sub memory array SMA22 may include a first complementary bit line BLB11 and a second complementary bit line BLB22. The first complementary bit line BLB11 and the second complementary bit line BLB22 may extend in the first direction X. The first complementary bit line BLB11 may be connected to both the second sub sense amplifier SA22 and the second sub sense amplifier SA32, and the second complementary bit line BLB22 may be connected to the second sub sense amplifier SA22. The second word line WL2 may be connected to both the first complementary bit line BLB11 and the second complementary bit line BLB22.

The first sub sense amplifier SA11 may be connected to the first complementary bit line BLB11 through a first metal line ML11. The first sub sense amplifier SA11 may perform a read/write operation on a memory cell connected to the first bit line BL11 using the first complementary bit line BLB11. Here, the first metal line ML11 may extend through the substrate under the first decoder SWD11. Accordingly, a dummy bit line of the first edge region EDG1 is not present, and accordingly, the memory device 100 having a reduced area, yet increased cell density may be provided.

Referring to FIG. 6, the first sub sense amplifier SA11 may be connected to both the first bit line BL11 and the first complementary bit line BLB11.

A first memory cell MC1 may be connected to both the first bit line BL11 and the first word line WL1, and located at the point where the first bit line BL11 and the first word line WL1 intersect. The first memory cell MC1 may include a first transistor TR1 and a first capacitor C1. The first memory cell MC1 may perform a read/write operation by charging or discharging the first capacitor C1 by the first sub sense amplifier SA11.

A first memory cell MC1' may be connected both the first complementary bit lime BLB11 and the second word line WL2, and located at the point where the first complementary bit line BLB11 and the second word line WL2 intersect. The first memory cell MC1' may include a first transistor TR1' and a first capacitor C1. The first memory cell MC1' may correspond to a memory cell referred to when the first sub sense amplifier SA11 performs a read/write operation on the first memory cell MC1. That is, the first memory cell MC1' may correspond to a complementary relationship with the first memory cell MC1. Further, the first complementary bit line BLB11 may correspond to a complementary relationship with the first bit line BL11.

In some embodiments, the first bit line BL11 may be included in the first sub memory array SMA11 while the first complementary bit line BLB11 may be included in the second sub memory array SMA22. That is, the first sub sense amplifier SA11 may perform a read/write operation on the first bit line BL11 using the first complementary bit line BLB11 connected through the first metal line ML11.

The first complementary bit line BLB11 may be connected to the second sub sense amplifier SA32. The second sub sense amplifier SA32 may perform a read/write operation on a memory cell connected to the second bit line BL32 using the first complementary bit line BLB11. That is, both the first sub sense amplifier SA11 and the second sub sense amplifier SA32 may use the first complementary bit line BLB11.

The second sub sense amplifier SA12 may be connected to a second metal line ML12. The second sub sense amplifier SA12 may be connected to a complementary bit line located in the center region CNT through the second metal line ML12. The second sub sense amplifier SA12 located in the first edge region EDG1 may perform a read/write operation using a complementary bit line located in the center region CNT. That is, components located in different regions may be connected through the second metal line ML12.

Although the first edge region EDG1 has been specifically described, those skilled in the art will appreciate that this description may be applied to the second edge region EDG2. That is, the first sub sense amplifier SA(m+1)l located in the second edge region EDG2 may be connected to a complementary bit line located in the center region CNT through a metal line, and may perform a read/write operation on a memory cell connected to a bit line included in the first sub memory array SMAm1 using the corresponding complementary bit line.

Accordingly, areas of the portions corresponding to the first edge region EDG1 and the second edge region EDG2 may be reduced, and the memory device 100 having an increased cell area may be provided.

Figure 7:
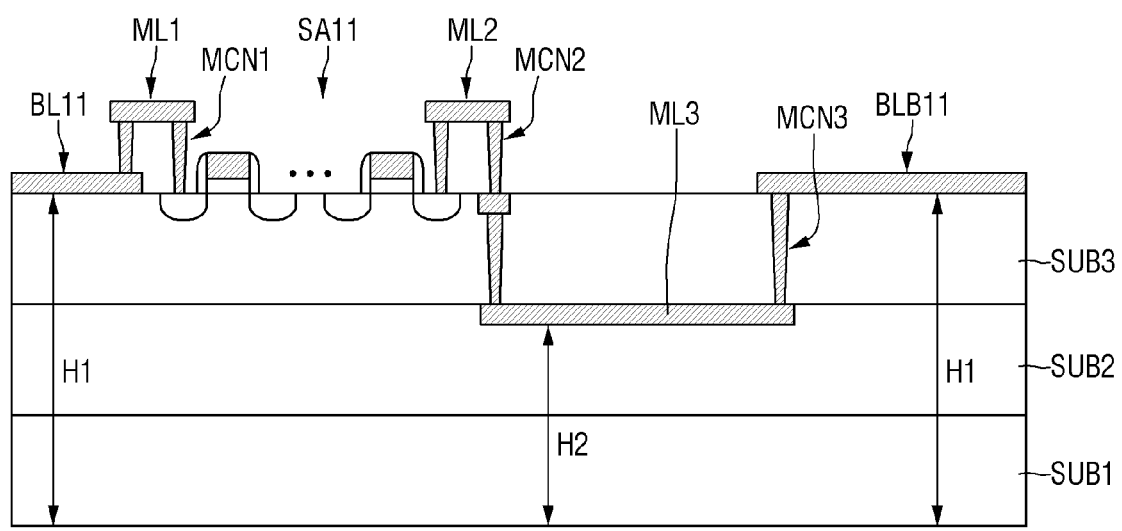
FIG. 7 is a cross-sectional view further illustrating the first region REG1 of FIG. 4.

FIG. 7 is a cross-sectional view further illustrating the first region REG1 of FIG. 4.

Referring to FIGS. 3 and 7, the second bank memory array BMA2 may include a first substrate SUB1, a second substrate SUB2, a third substrate SUB3, the first sub sense amplifier SA11, first to third metal lines ML1 to ML3, first to third metal contacts MCN1 to MCN3, the first bit line BL11, and the first complementary bit line BLB11.

The second substrate SUB2 may be disposed on the first substrate SUB1, and the third substrate SUB3 may be disposed on the second substrate SUB2. The first metal line ML11 of FIG. 5 may correspond to the third metal line ML3 and the third metal contact MCN3.

The first bit line BL11 may be connected to the first sub sense amplifier SA11 through the first metal line ML1 and the first metal contact MCN1, and the first complementary bit line BLB11 may be connected to the first sub sense amplifier SA11 through the second metal line ML2, the third metal line ML3, the second metal contact MCN2, and the third metal contact MCN3.

Here, the third metal line ML3 may be disposed in the second substrate SUB2, and the third metal contact MCN3 may be disposed in the third substrate SUB3. Further, the first sub sense amplifier SA11, the first and second metal lines ML1 and ML2, the first and second metal contacts MCN1 and MCN2, the first bit line BL11, and the first complementary bit line BLB11 may be disposed on the third substrate SUB3. Here, a first height H1, which is the height from the bottom of the first substrate SUB1 to the first bit line BL11 and the first complementary bit line BLB11 may be greater than a second height H2, which is the height from the bottom of the first substrate SUB1 to the third metal line ML3. That is, the third metal line ML3 may be buried in a lower substrate, and may connect the first sub sense amplifier SA11 with the first complementary bit line BLB11.

Figure 8:
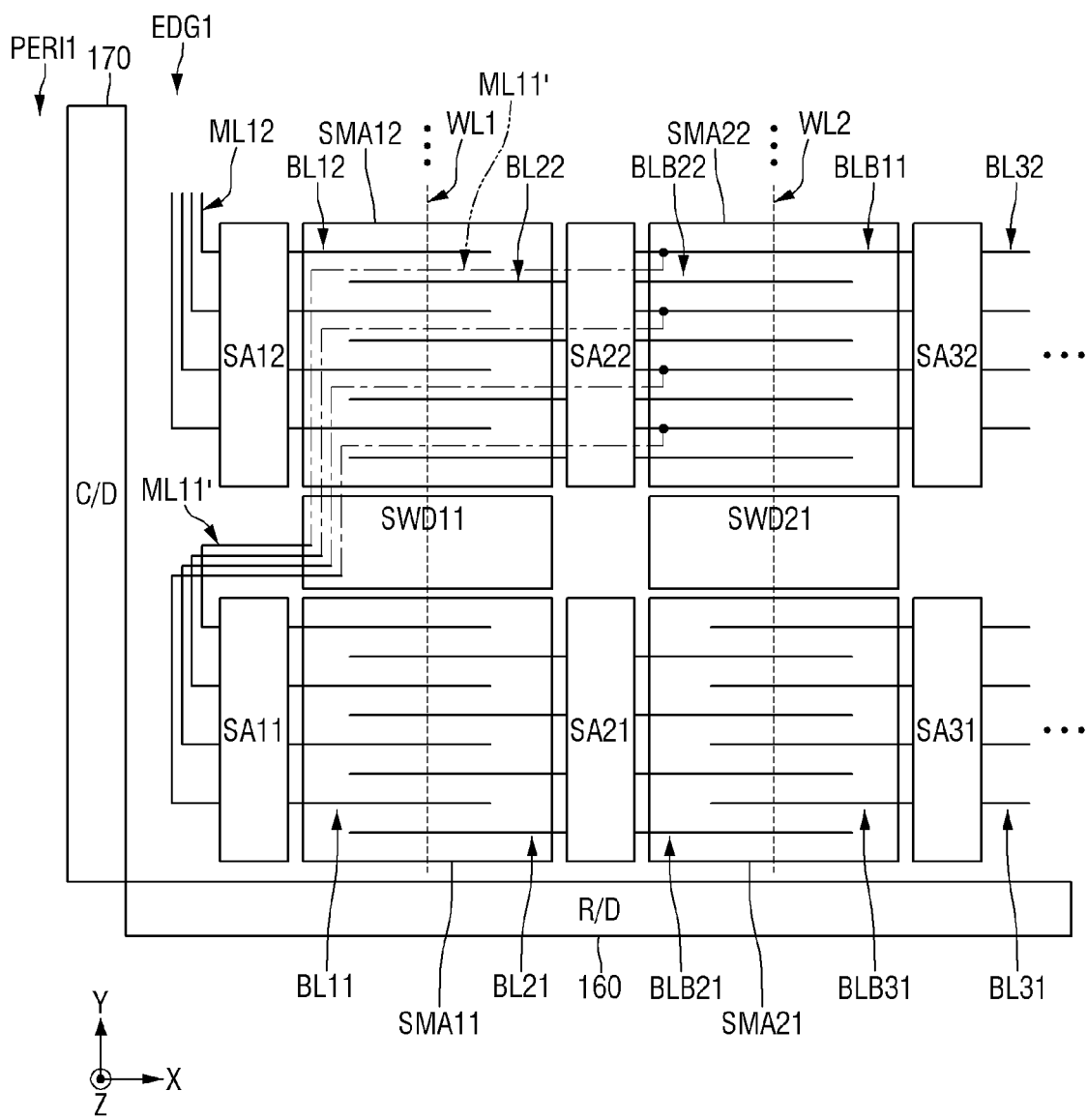
FIG. 8 is an enlarged view illustrating the first region REG1 according to embodiments.
Figure 9:
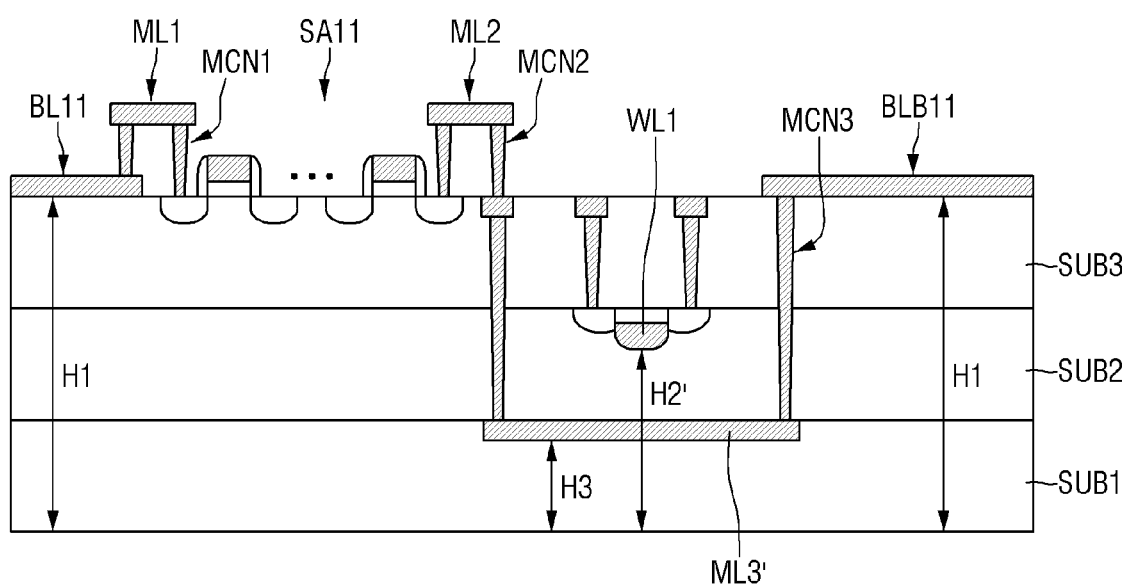
FIG. 9 is a cross-sectional view further illustrating the first region REG1 of FIG. 8.

FIG. 8 is a view illustrating the first region REG1 according to some embodiments, and FIG. 9 is a cross-sectional view further illustrating the first region REG1 of FIG. 8.

Referring to FIG. 8, the second memory bank BNK2 corresponding to the first region REG1 may include a first metal line ML11'. The first metal line ML1F may connect the first sub sense amplifier SA11 with the first complementary bit line BLB11. Here, the first metal line ML1F may be overlapped by the second sub memory array SMA12. That is, the first metal line ML1F may be formed in a region deeper than the second sub memory array SMA12.

Referring to FIG. 9, the first word line WL1 may be disposed in the second substrate SUB2. The first word line WL1 may be formed to intersect the first bit line BL11 and the first complementary bit line BLB11. The first word line WL1 may be spaced apart from the bottom of the first substrate SUB1 by a second height H2'. The second height H2' may be less than the first height H1.

In some embodiments, a third metal line ML3' may be formed in the first substrate SUB1. The first metal line ML3' may be connected to the first bit line BL11 and the first complementary bit line BLB11 through the second metal contact MCN2 and the third metal contact MCN3. The third metal line ML3' may be spaced apart from the bottom of the first substrate SUB1 by a third height H3. The third height H3 may be less than the second height H2'. That is, the third metal line ML3' or the first metal line ML11' may be formed in a region deeper than the first word line WL1.

Figure 10:
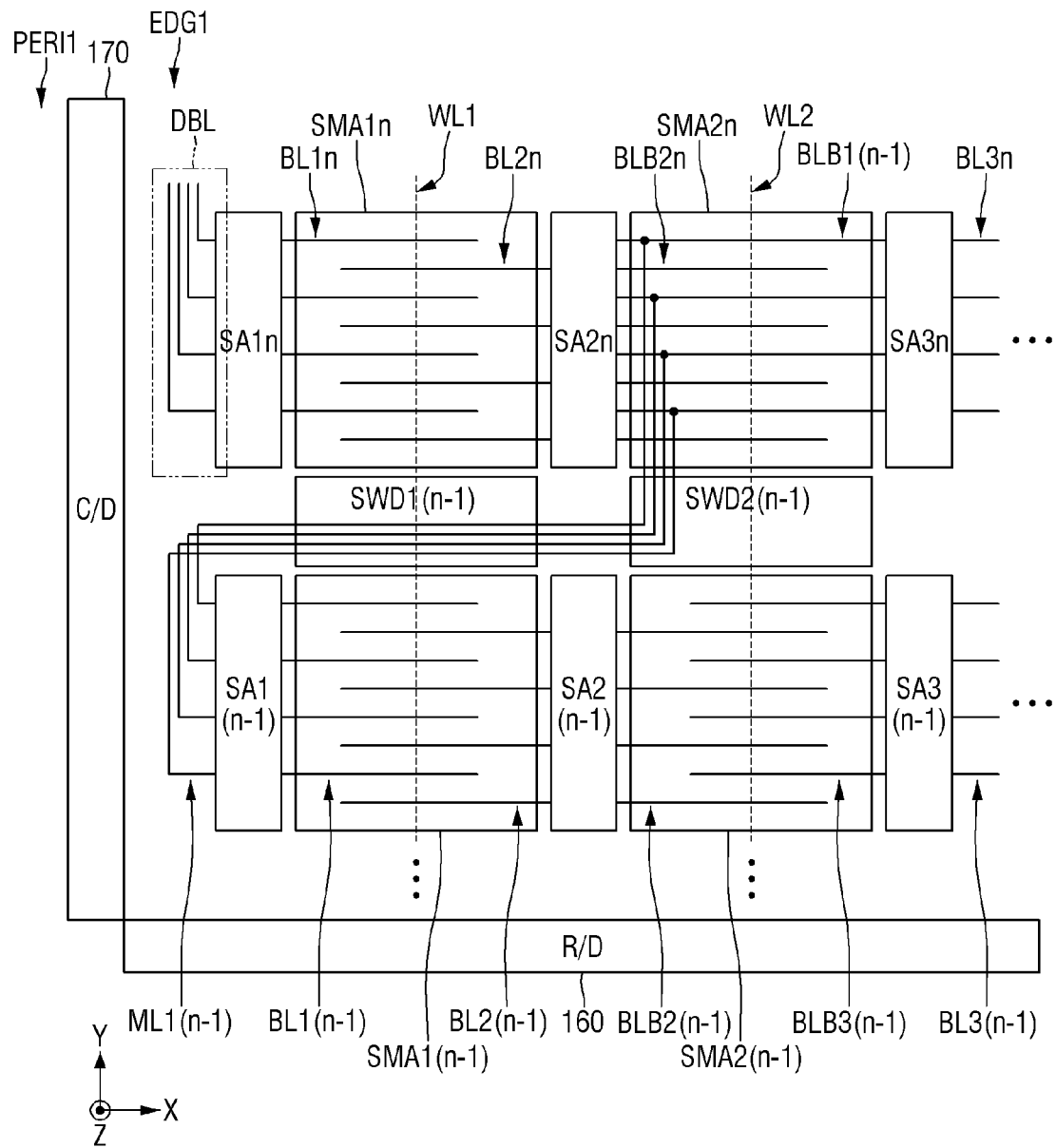
FIG. 10 is an enlarged view further illustrating the second region REG2 of FIG. 4.

FIG. 10 is an enlarged view further illustrating the second region REG2 of FIG. 4.

Referring to the FIG. 10, the second bank memory array BMA2 corresponding to a second region REG2 may include the (n−1)th sub sense amplifier SA1($n$−1), the nth sub sense amplifier SA1$n$, the (n−1)th sub sense amplifier SA2($n$−1), the nth sub sense amplifier SA2$n$, the (n−1)th sub sense amplifier SA3($n$−1), and an nth sub sense amplifier SA3$n$. Further, the second bank memory array BMA2 may include the (n−1)th sub memory array SMA1($n$−1) disposed between the (n−1)th sub sense amplifier SA1($n$−1) and the (n−1)th sub sense amplifier SA2($n$−1), and the (n−1)th sub memory array SMA2($n$−1) disposed between the (n−1)th sub sense amplifier SA2($n$−1) and the (n−1)th sub sense amplifier SA3($n$−1). Further, the second bank memory array BMA2 may include the nth sub memory array SMA1$n$ disposed between the nth sub sense amplifier SA1$n$ and the nth sub sense amplifier SA2$n$, and the nth sub memory array SMA2$n$ disposed between the nth sub sense amplifier SA2$n$ and the nth sub sense amplifier SA3$n$.

The (n−1)th sub memory array SMA1($n$−1) may include an (n−1)th bit line BL1($n$−1) connected to the (n−1)th sub sense amplifier SA1($n$−1) and an (n−1)th bit line BL2($n$−1) connected to the (n−1)th sub sense amplifier SA2($n$−1).

The (n−1)th sub memory array SMA2($n$−1) may include an (n−1)th complementary bit line BLB2($n$−1) connected to the (n−1)th sub sense amplifier SA2($n$−1) and an (n−1)th complementary bit line BLB3($n$−1) connected to the (n−1)th sub sense amplifier SA3($n$−1).

The nth sub memory array SMA1$n$ may include an nth bit line BL1$n$ connected to the nth sub sense amplifier SA1$n$, and an nth bit line BL2$n$ connected to the nth sub sense amplifier SA2$n$.

The nth sub memory array SMA2$n$ may include an nth complementary bit line BLB2$n$ connected to the nth sub sense amplifier SA2$n$ and an (n−1)th complementary bit line BLB1($n$−1) connected to the nth sub sense amplifier SA3$n$. Here, the (n−1)th complementary bit line BLB1($n$−1) may be connected to both the nth sub sense amplifier SA3$n$ and the (n−1)th sub sense amplifier SA1($n$−1).

An (n−1)th metal line ML1($n$−1) may connect the (n−1)th sub sense amplifier SA1($n$−1) with the (n−1)th complementary bit line BLB1($n$−1). The (n−1)th sub sense amplifier SA1($n$−1) may perform a read/write operation on a memory cell connected to the (n−1)th bit line BL1($n$−1) using the (n−1)th complementary bit line BLB1($n$−1).

The second bank memory array BMA2 corresponding to the second region REG2 may include a dummy bit line DBL. The dummy bit line DBL may be disposed in the first edge region EDG1 and connected to the nth sub sense amplifier SA1$n$. The nth sub sense amplifier SA1$n$ does not perform a read/write operation on the nth bit line BL1$n$ using the dummy bit line DBL.

Figure 11:
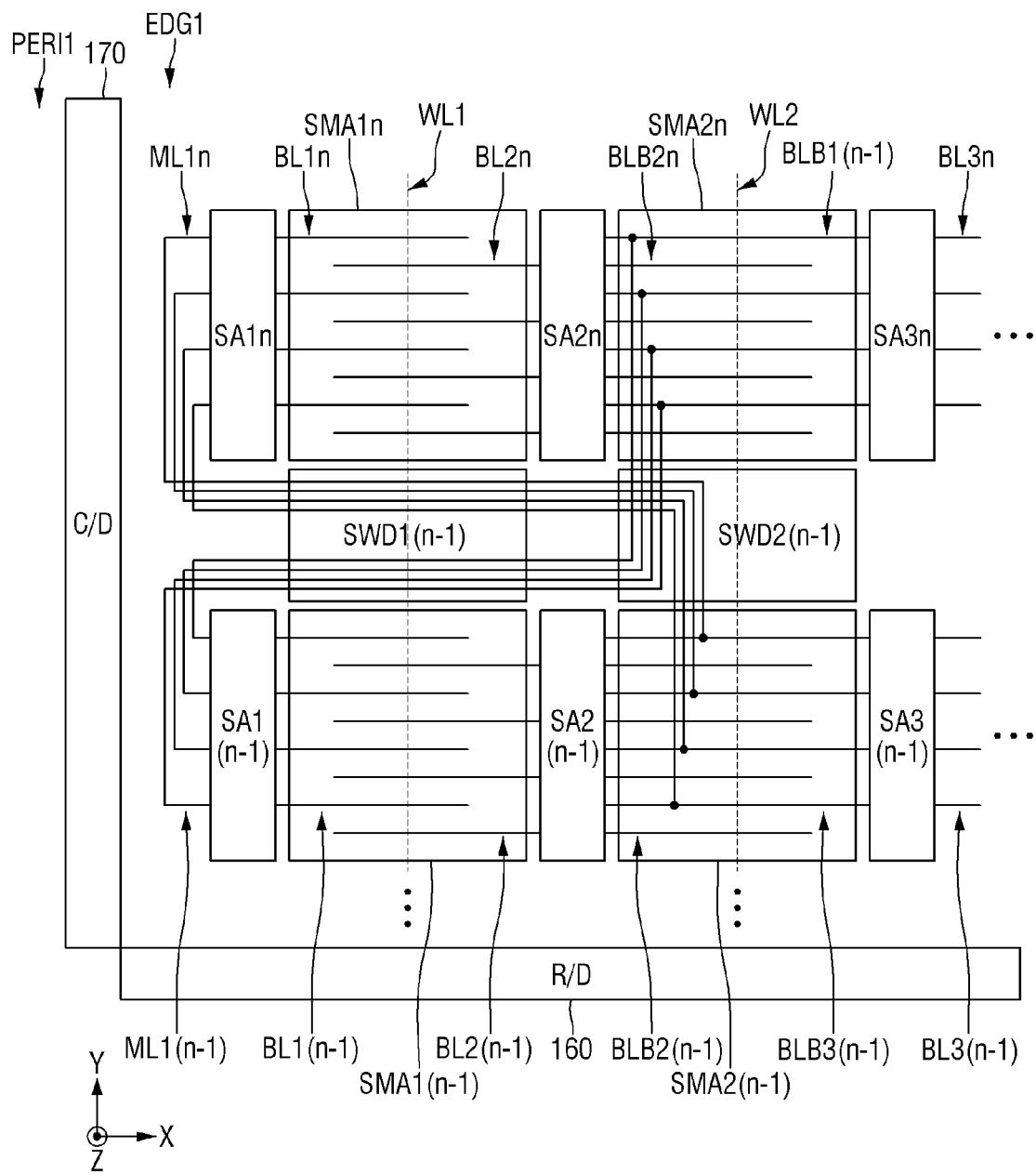
FIG. 11 is an enlarged view further illustrating the second region REG2 of FIG. 4.

FIG. 11 is an enlarged view further illustrating the second region REG2 of FIG. 4.

Referring to FIG. 11, the second bank memory array BMA2 corresponding to the second region REG2 may include an nth metal line ML1$n$ instead of the dummy bit line DBL. The nth metal line ML1$n$ may connect the nth sub sense amplifier SA1$n$ with the (n−1)th complementary bit line BLB3($n$−1). Accordingly, the nth sub sense amplifier SA1$n$ may perform a read/write operation on the nth bit line BL1$n$ using the (n−1) the complementary bit line BLB3($n$−1). Accordingly, the memory device 100 having an increased cell density may be provided.

Hereinafter, a second memory bank BNK2 according to some other embodiments will be described in some additional detail with reference to FIGS. 12, 13 and 14.

Figure 12:
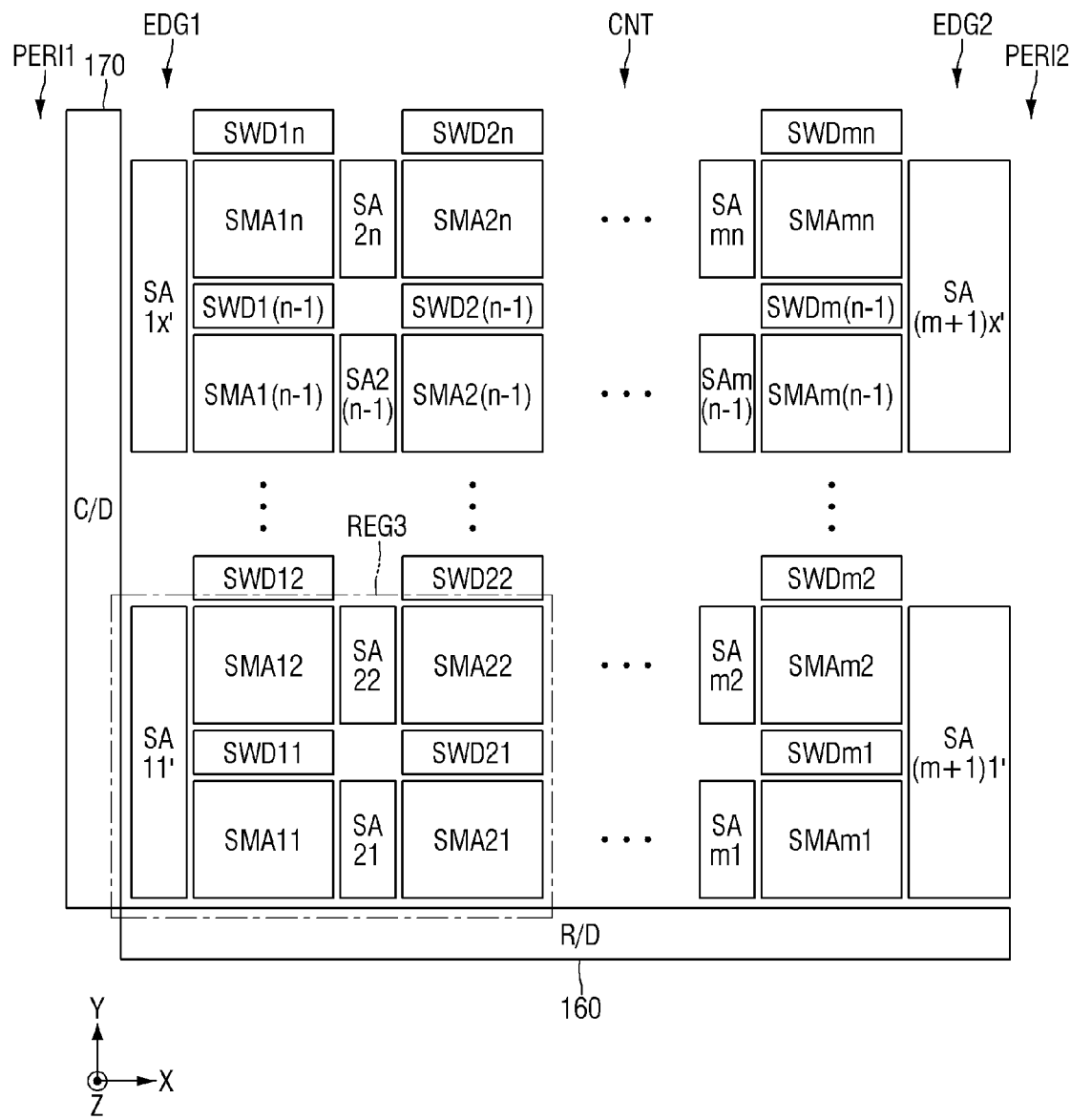
FIG. 12 is a view illustrating the second memory bank according to some embodiments.
Figure 13:
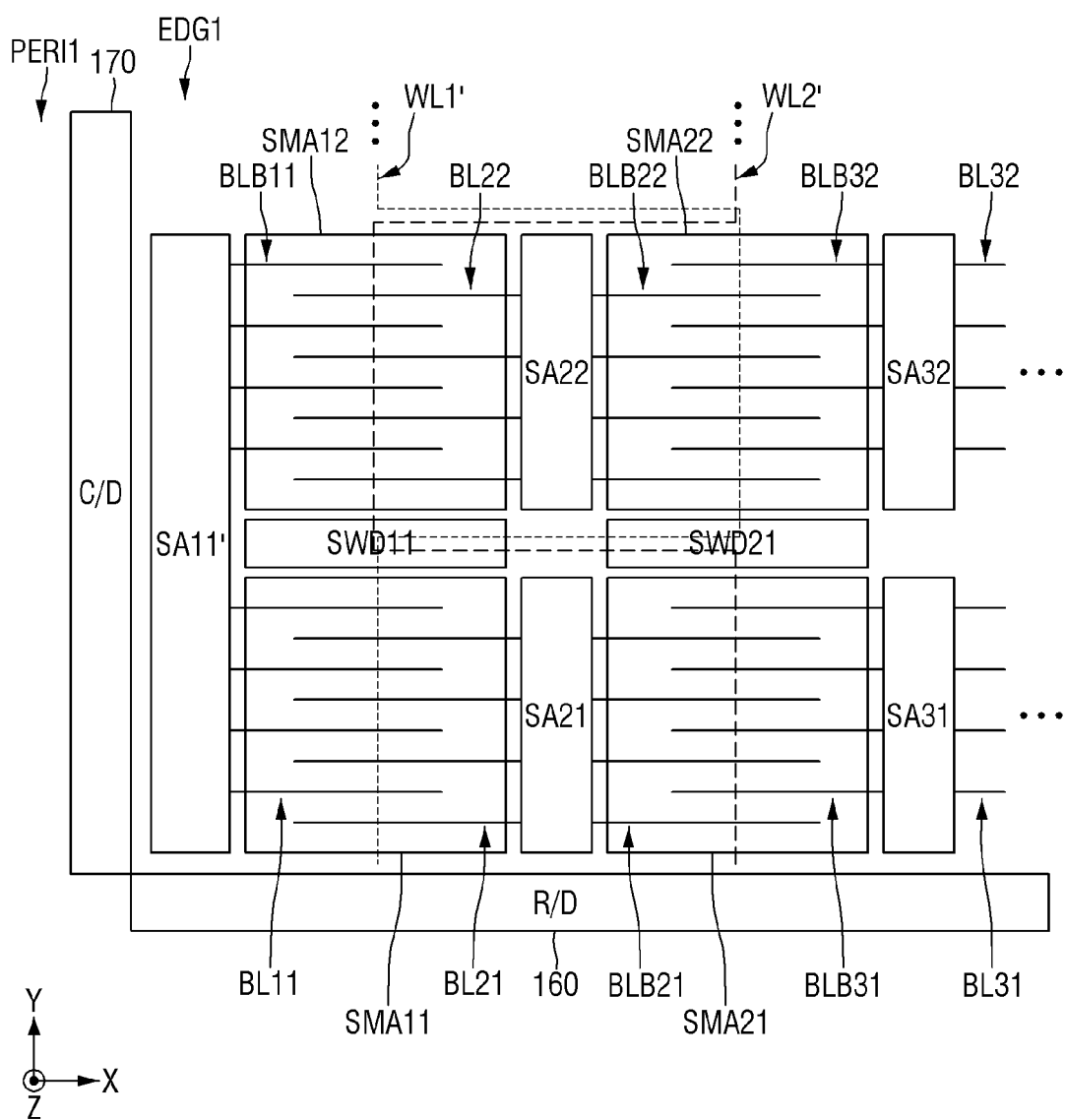
FIG. 13 is an enlarged view further illustrating the second region REG2 of FIG. 12.
Figure 14:
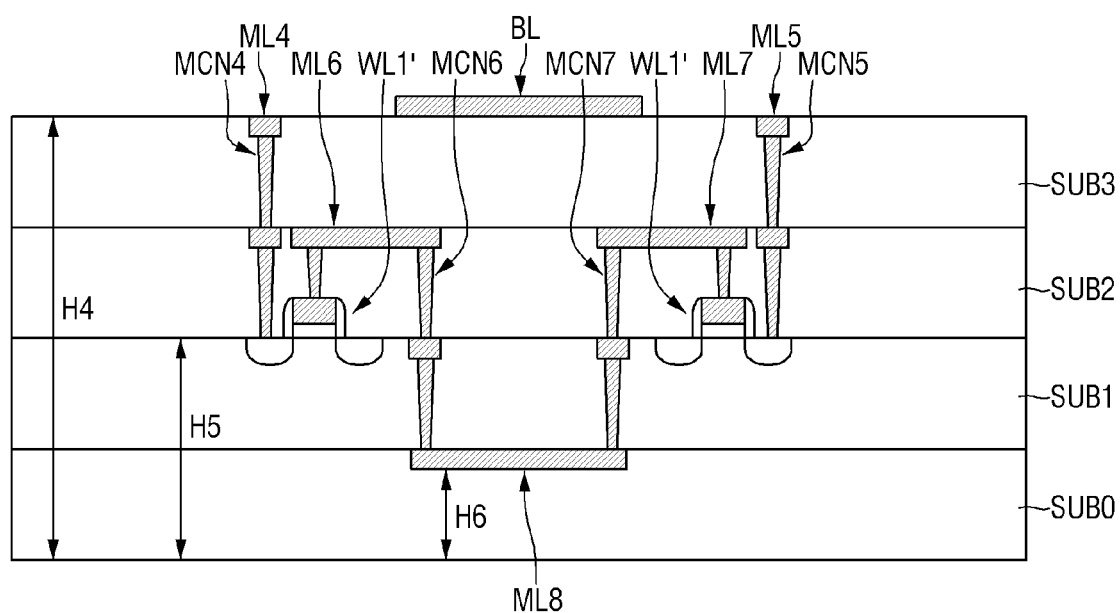
FIG. 14 is a cross-sectional view further illustrating the second region REG2 of FIG. 13.

FIG. 12 is a view illustrating the second memory bank according to some embodiments, FIG. 13 is an enlarged view further illustrating the second region REG2 of FIG. 12, and FIG. 14 is a cross-sectional view further illustrating the second region REG2 of FIG. 13.

Referring to FIG. 12, the second memory bank BNK2 may include first to xth sub sense amplifiers SA11' to SA1$x$' disposed in the first edge region EDG1 and first to xth sub sense amplifiers SA(m+1)l' to SA(m+1)x' disposed in the second edge region EDG2. The first to the xth sub sense amplifiers SA11' to SA1$x$' may be connected to the first to the nth sub memory arrays SMA11 to SMA1$n$, respectively and the first to the xth sub sense amplifiers SA(m+1)l' to SA(m+1)x' may be connected to the first to the nth sub memory arrays SMAm1 to SMAmn, respectively. Here, 'n' may be an integer that is twice (2x) 'x'.

Referring to FIG. 13, the second memory bank BNK2 corresponding to a third region REG3 may include the first and second sub memory arrays SMA11 and SMA12, the first and second sub memory arrays SMA21 and SMA22, the first sub sense amplifier SA11', the first and second sub sense amplifiers SA21 and SA22, and the first and second sub sense amplifiers SA31 and SA32. In some embodiments, the second memory bank BNK2 may include a first word line WL1' and a second word line WL2' formed in a zigzag pattern.

The first sub sense amplifier SA11' may be connected to both the first bit line BL11 and the first complementary bit line BLB11. The first sub sense amplifier SA11' may perform a read/write operation on a memory cell of the first bit line BL11 using the first complementary bit line BLB11.

The first word line WL1' may be formed in the first sub memory array SMA11 and the second sub memory array SMA22. The second word line WL2' may be formed in the first sub memory array SMA21 and the second sub memory array SMA12. That is, the first word line WL1' and the second word line WL2' may be formed in a zigzag pattern.

The first word line WL1' may be connected to the first bit line BL11, and the second word line WL2' may be connected to the first complementary bit line BLB11. Accordingly, the first bit line BL11 and the first complementary bit line BLB11 may be independently controlled.

In some embodiments, as both the first bit line BL11 and the first complementary bit line BLB11 are connected to the first sub sense amplifier SA11' in the first edge region EDG1, a dummy mat may not be formed in the first edge region EDG1. Accordingly, the memory device 100 having an increased cell density may be provided.

Referring to FIG. 14, the second bank memory array BMA2 may include a substrate SUB0, the first substrate SUB1, the second substrate SUB2, the third substrate SUBS, a bit line BL, the first word line WL1', fourth to eighth metal lines ML4 to ML8, fourth to seventh metal contacts MCN4 to MCN7, etc.

The first substrate SUB1 may be disposed on the substrate SUB0, the second substrate SUB2 may be disposed on the first substrate SUB1, and the third substrate SUB3 may be disposed on the second substrate SUB2. A metal line connecting the first word line WL1' of FIG. 13 may correspond to the eighth metal line ML8.

The eighth metal line ML8 may be disposed in the substrate SUB0. The eighth metal line ML8 may have a sixth height H6 from the bottom of the substrate SUB0. The first word line WL1', the sixth and seventh metal lines ML6 and ML7, and the sixth and seventh metal contacts MCN6 and MCN7 may be disposed in the first and second substrates SUB1 and SUB2. The first word line WL1' may be connected to the eighth metal line ML8 through the sixth and seventh metal lines ML6 and ML7 and the sixth and seventh metal contacts MCN6 and MCN7. Here, the distance from the substrate SUB0 to the first word line WL1' may correspond to a fifth height H5. The fifth height H5 may be greater than the sixth height H6. That is, the eighth metal line ML8 may be formed to be buried under the first word line WL1'.

The bit line BL, the fourth and fifth metal lines ML4 and ML5, and the fourth and fifth metal contacts MCN4 and MCN5 may be formed in the third substrate SUB3. Here, a fourth height H4 which is a height from the bottom of the substrate SUB0 to the bit line BL may be greater than the fifth and sixth heights H5 and H6.

Figure 15:
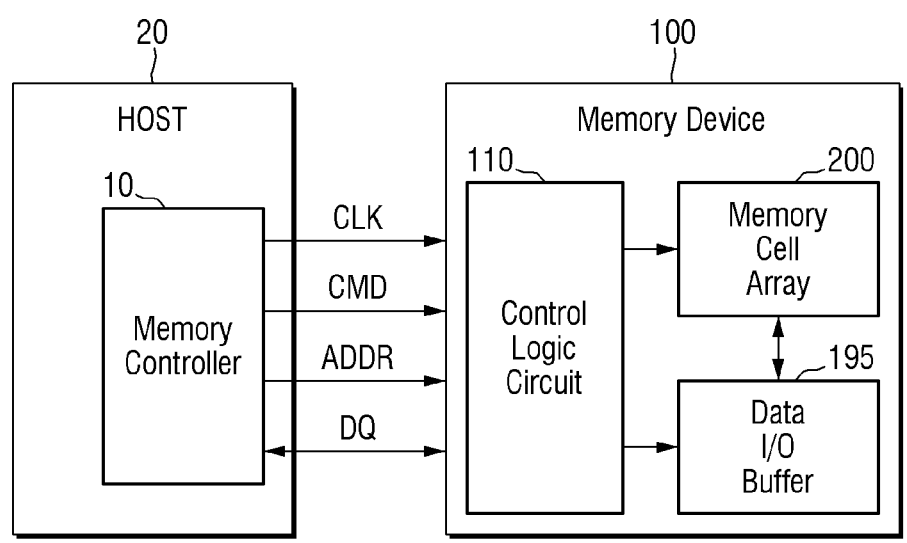
FIG. 15 is a block diagram illustrating a memory system according to embodiments.

FIG. 15 is a block diagram illustrating a memory system according to some embodiments.

Referring to FIG. 15, the host device 20 may include the memory controller 10. That is, in contrast to the memory system of FIG. 1 in which the memory controller 10 is disposed external to the host device 20, the host device 20 of FIG. 15 may be disposed internal to the host 20. With this configuration, the host device 20 may control operation of the memory device 100 using the memory controller 10. Here, the host device 20 may communicate with the memory device 100 according to one or more conventionally-understood and/or commercially-available technical standards associated with protocols used n relation to a double data rate (DDR), a low power double data rate (LPDDR), a graphics double data rate (GDDR), a Wide I/O, a high bandwidth memory (HBM), a hybrid memory cube (HMC), or a compute express link (CXL).

Figure 16:
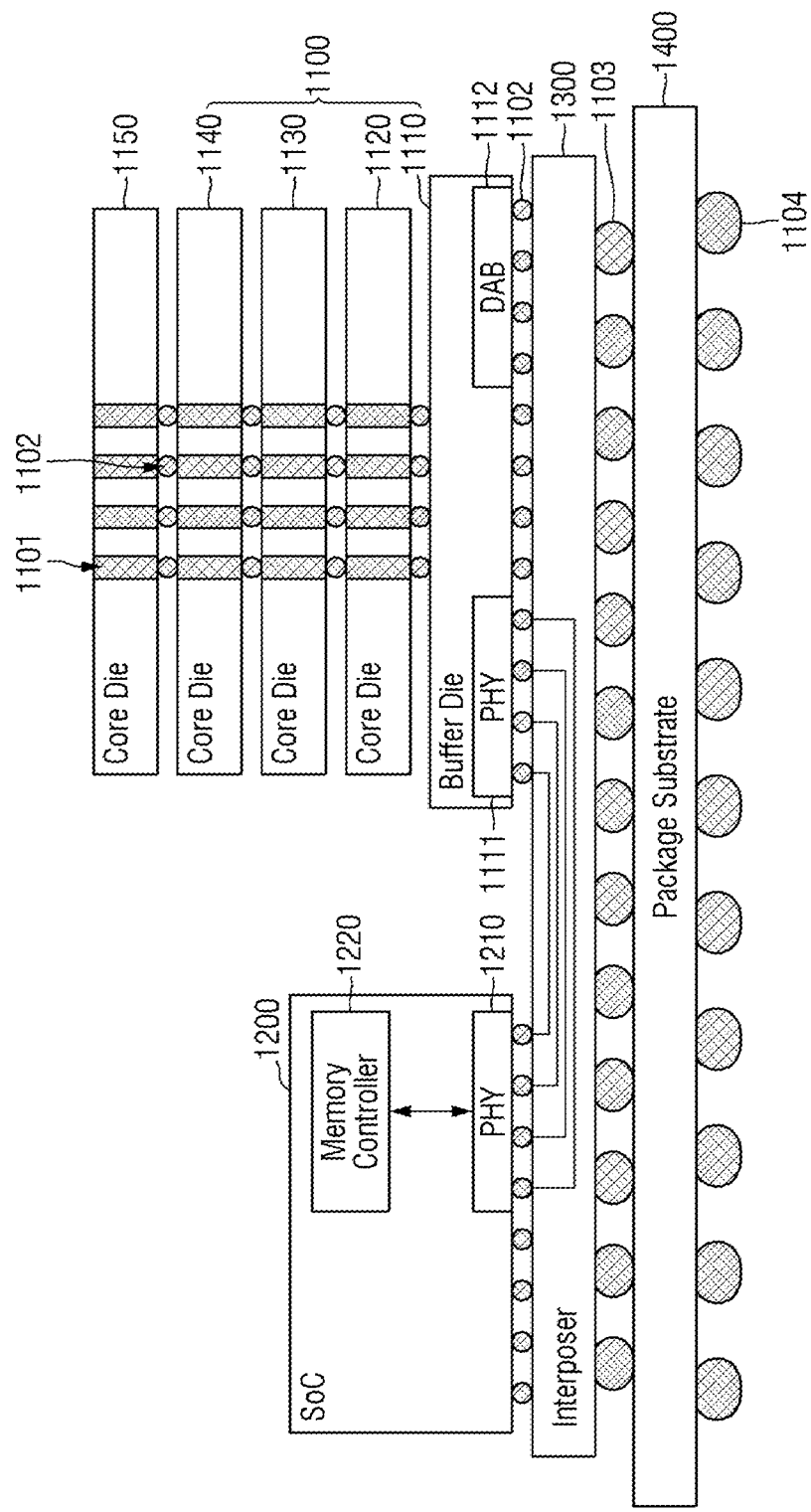
FIG. 16 is a cross-sectional view illustrating a semiconductor package according to embodiments.

FIG. 16 is a cross-sectional view illustrating a semiconductor package according to some embodiments.

Referring to FIG. 16, a semiconductor package 1000 may include a stacked memory device 1100, a system on chip 1200, an interposer 1300, and a package substrate 1400. The stacked memory device 1100 may include a buffer die 1110 and core dies 1120 to 1150.

Each of the core dies 1120 to 1150 may include a memory cell array. The core dies 1120 to 1150 may include the memory device 100 described with reference to FIG. 1 to FIG. 15. The buffer die 1110 may include a physical layer 1111 and a direct access region (DAB) 1112. The physical layer 1111 may be electrically connected to a physical layer 1210 of the system on chip 1200 through the interposer 1300. The stacked memory device 1100 may receive signals from the system on chip 1200 or transmit signals to the system on chip 1200 through the physical layer 1111.

The direct access region 1112 may provide an access path to test the stacked memory device 1100 without going through the system on chip 1200. The direct access region 1112 may include a conductive part (e.g., ports or pins) that may communicate directly with an external test device. A test signal and data received through the direct access region 1112 may be transmitted to the core dies 1120 to 1150 through TSVs. Data read from the core dies 1120 to 1150 for testing the core dies 1120 to 1150 may be transmitted to the test device through the TSVs and the direct access region 1112. Accordingly, a direct access test for the core dies 1120 to 1150 may be performed.

The buffer die 1110 and the core dies 1120 to 1150 may be electrically connected to each other through the TSVs 1101 and bumps 1102. The buffer die 1110 may receive signals provided to each channel from the system on chip 1200 through the bumps 1102 allocated for each channel. For example, the bumps 1102 may be micro bumps.

The system on chip 1200 may execute applications supported by the semiconductor package 1000 using the stacked memory device 1100. For example, the system on chip 1200 may execute specialized operations by including and using at least one processor of a central processing unit (CPU), an application processor (AP), a graphic processing unit (GPU), a neural processing unit (NPU), a tensor processing unit (TPU), a vision processing unit (VPU), an image signal processor (ISP), and a digital signal processor (DSP).

The system on chip 1200 may include the physical layer 1210 and a memory controller 1220. The physical layer 1210 may include I/O circuits for transmitting and receiving signals to and from the physical layer 1111 of the stacked memory device 1100. The system on chip 1200 may provide various signals to the physical layer 1111 through the physical layer 1210. The signals provided to the physical layer 1111 may be transmitted to the core dies 1120 to 1150 through the TSVs 1101 and interface circuits of the physical layer 1111.

The memory controller 1220 may control the overall operation of the stacked memory device 1100. The memory controller 1220 may transmit signals for controlling the stacked memory device 1100 to the stacked memory device 1100 through the physical layer 1210. The memory controller 1220 may correspond to the memory controller 10 of FIG. 1.

The interposer 1300 may connect the stacked memory device 1100 with the system on chip 1200. The interposer 1300 may connect the physical layer 1111 of the stacked memory device 1100 with the physical layer 1210 of the system on chip 1200, and provide physical paths formed using conductive materials. Accordingly, the stacked memory device 1100 and the system on chip 1200 may be stacked on the interposer 1300 to transmit and receive signals to and from each other.

Bumps 1103 may be attached at the top of the package substrate 1400, and solder balls 1104 may be attached at the bottom of the package substrate 1400. For example, the bumps 1103 may be flip-chip bumps. The interposer 1300 may be stacked on the package substrate 1400 through the bumps 1103. The semiconductor package 1000 may transmit and receive signals to and from other external packages or semiconductor devices through the solder ball 1104. For example, the package substrate 1400 may be a printed circuit board (PCB).

Figure 17:
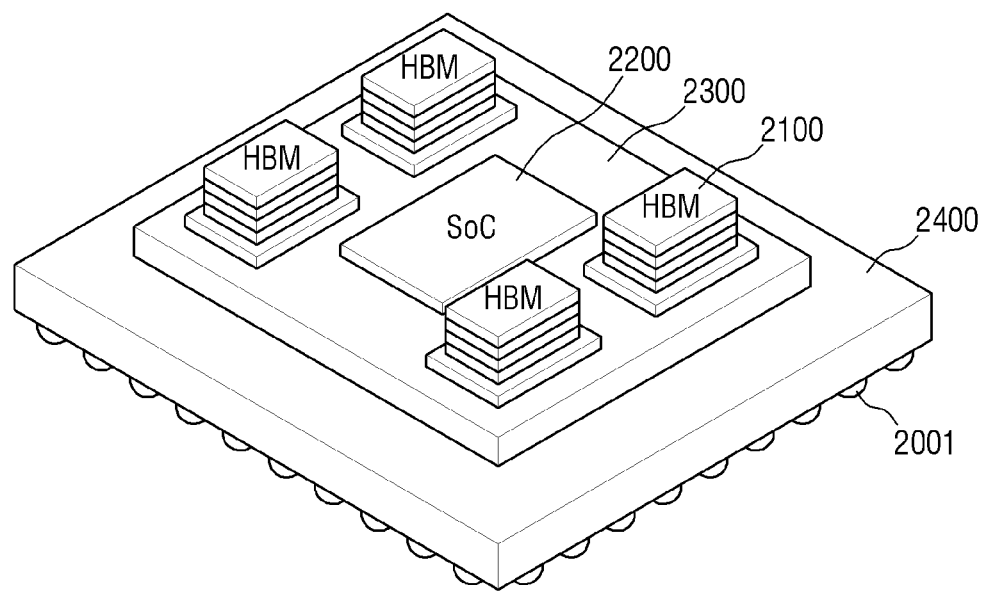
FIG. 17 is a perspective view illustrating an implementation example for semiconductor packages according to some embodiments.

FIG. 17 is a perspective view illustrating one implementation example of a semiconductor package according to some embodiments.

Referring to FIG. 17, a semiconductor package 2000 may include a plurality of stacked memory devices 2100 and a system on chip 2200. The stacked memory devices 2100 and the system on chip 2200 may be stacked on an interposer 2300, and the interposer 2300 may be stacked on a package substrate 2400. The semiconductor package 2000 may transmit and receive signals to and from other external packages or semiconductor devices through solder balls 2001 attached at the bottom of the package substrate 2400.

Each of the stacked memory devices 2100 may be implemented based on an HBM standard. However, the present disclosure is not limited thereto, and each of the stacked memory devices 2100 may be implemented based on a GDDR, a HMC, or a Wide I/O standard. Each of the stacked memory devices 2100 may correspond to the stacked memory device 1100 of FIG. 16.

The system on chip 2200 may include at least one processor such as a CPU, an AP, a GPU, and an NPU and a plurality of memory controllers for controlling the plurality of stacked memory devices 2100. The system on chip 2200 may transmit and receive signals to and from a corresponding stacked memory device through a memory controller. The system on chip 2200 may correspond to the system on chip 1200 of FIG. 16.

Figure 18:
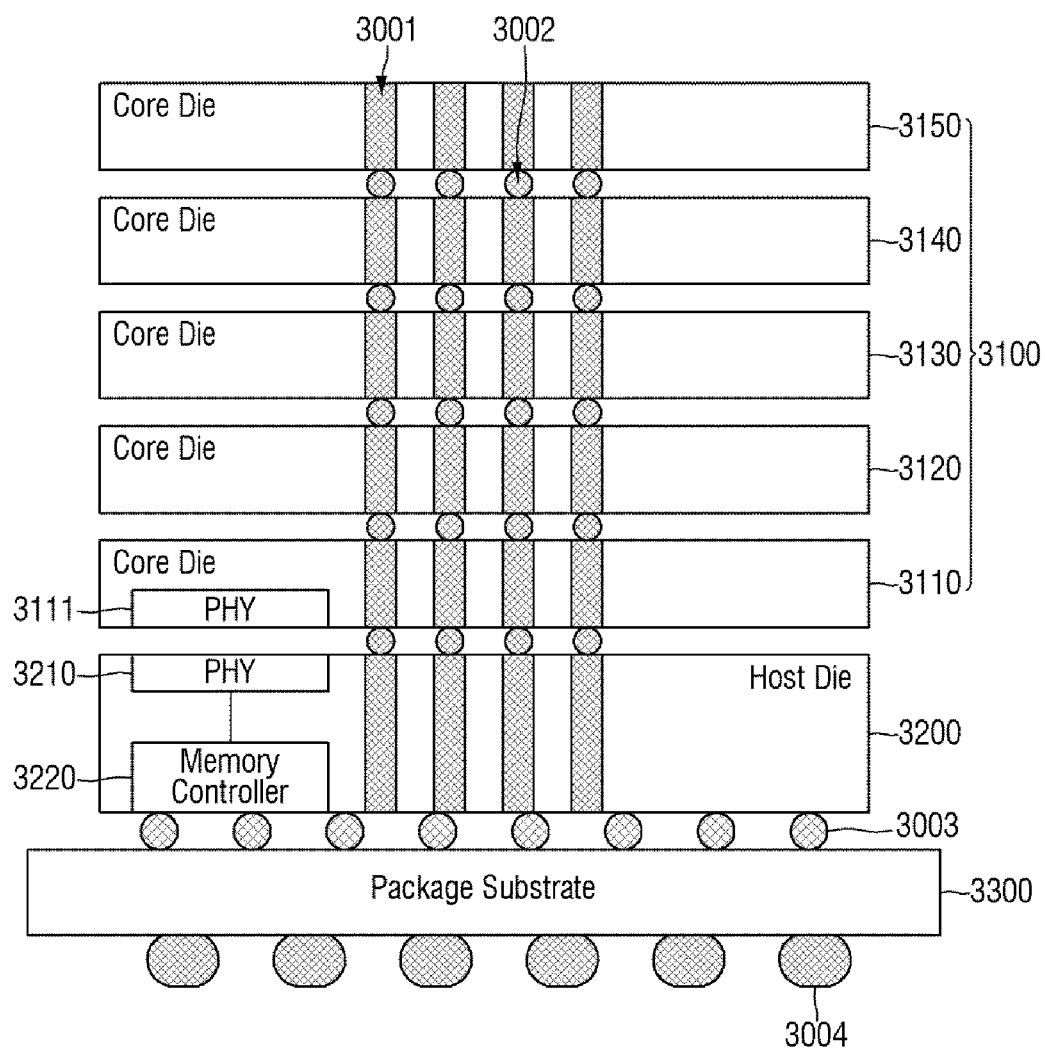
FIG. 18 is a cross-sectional view illustrating a semiconductor package according to some embodiments.

FIG. 18 is a cross-sectional view illustrating a semiconductor package according to some embodiments.

Referring to FIG. 18, a semiconductor package 3000 may include a stacked memory device 3100, a host die 3200, and a package substrate 3300. The stacked memory device 3100 may include a buffer die 3110 and core dies 3120 to 3150. The buffer die 3110 may include a physical layer 3111 for communicating with the host die 3200, and each of the core dies 3120 to 3150 may include a memory cell array.

The host die 3200 may include a physical layer 3210 for communicating with the stacked memory device 3100 and a memory controller 3220 for controlling the overall operation of the stacked memory device 3100. Further, the host die 3200 may include a processor for controlling the overall operation of the semiconductor package 3000 and executing an application supported by the semiconductor package 3000. For example, the host die 3200 may include at least one processor such as a CPU, an AP, a GPU, or an NPU.

The stacked memory device 3100 may be disposed on the host die 3200 based on TSVs 3001, and vertically stacked on the host die 3200. Accordingly, the buffer die 3110, the core dies 3120 to 3150, and the host die 3200 may be electrically connected to each other through the TSVs 3001 and bumps 3002 without an interposer. For example, the bumps 3002 may be micro bumps.

Bumps 3003 may be attached at the top of the package substrate 3300, and solder balls 3004 may be attached at the bottom of the package substrate 3300. For example, the bumps 3003 may be flip-chip bumps. The host die 3200 may be stacked on the package substrate 3300 through the bumps 3003. The semiconductor package 3000 may transmit and receive signals to and from other external packages or semiconductor devices through the solder balls 3004.

Although the embodiments of the present disclosure have been described above with reference to the accompanying drawings, those skilled in the art will appreciate that various modifications may be made to same without removing the resulting embodiments from the scope of the present disclosure, as defined by the following claims.

What is claimed is:

1. A volatile memory device comprising:
   a first sense amplifier;
   a second sense amplifier spaced apart from the first sense amplifier in a first direction;
   a first mat disposed between the first sense amplifier and the second sense amplifier and including a first bit line connected to the first sense amplifier and a second bit line connected to the second sense amplifier;
   a third sense amplifier spaced apart from the second sense amplifier in a second direction;
   a fourth sense amplifier spaced apart from the third sense amplifier in the first direction; and
   a second mat disposed between the third sense amplifier and the fourth sense amplifier and including a first complementary bit line connected to the first sense amplifier.

2. The volatile memory device of claim 1, wherein the first sense amplifier is configured to perform a read/write operation on a first memory cell connected to the first bit line using the first complementary bit line.

3. The volatile memory device of claim 1, further comprising:
   a metal line connecting the first sense amplifier with the first complementary bit line.

4. The volatile memory device of claim 1, further comprising:
   a first word line connected to the first bit line and the second bit line of the first mat;
   a second word line connected to the first complementary bit line of the second mat; and
   a metal line connecting the first sense amplifier with the first complementary bit line, wherein the metal line is formed under the first and second word lines.

5. The volatile memory device of claim 4, wherein the metal line is formed under the first mat.

6. The volatile memory device of claim 1, further comprising:
   a fifth sense amplifier spaced apart from the first sense amplifier in the second direction; and
   a third mat disposed between the fifth sense amplifier and the third sense amplifier and including a third bit line connected to the third sense amplifier and a fourth bit line connected to the fifth sense amplifier.

7. The volatile memory device of claim 6, further comprising:
   a dummy bit line disposed in a direction opposite to the first direction from the fifth sense amplifier and connected to the fifth sense amplifier.

8. The volatile memory device of claim 6, further comprising:
   a sixth sense amplifier spaced apart from the second sense amplifier in the first direction; and
   a fourth mat disposed between the second sense amplifier and the sixth sense amplifier and including a fourth complementary bit line connected to the fifth sense amplifier.

9. The volatile memory device of claim 8, wherein the fifth sense amplifier is configured to perform a read/write operation on a fourth memory cell connected to the fourth bit line using the fourth complementary bit line.

10. The volatile memory device of claim 8, further comprising:
    a metal line connecting the fifth sense amplifier with the fourth complementary bit line.

11. The volatile memory device of claim 1, wherein the first complementary bit line is connected to the fourth sense amplifier.

12. A volatile memory device comprising:
a row decoder extending in a first direction;
a column decoder extending in a second direction; and
a memory cell array between the row decoder and the column decoder,
wherein the memory cell array includes:
a center region including a first sense amplifier, a first mat including a first bit line connected to the first sense amplifier, and a second mat including a first complementary bit line connected to the first sense amplifier; and
a first edge region disposed in the first direction from the center region,
wherein the first edge region includes a second sense amplifier and a third mat including a second bit line connected to the second sense amplifier and disposed in a third direction opposite to the first direction from the second sense amplifier, and
the second sense amplifier is connected to the first complementary bit line of the center region.

13. The volatile memory device of claim 12, wherein the memory cell array comprises a second edge region disposed in the third direction from the center region,
the center region includes a third sense amplifier, a third mat including a third bit line connected to the third sense amplifier and a fourth mat including a third complementary bit line connected to the third sense amplifier,
the second edge region includes a fourth sense amplifier, and a fourth mat disposed in the first direction from the fourth sense amplifier and including a fourth bit line connected to the fourth sense amplifier, and
the fourth sense amplifier is connected to the third complementary bit line of the center region.

14. The volatile memory device of claim 12, wherein the first sense amplifier is configured to perform a read/write operation on a first memory cell connected to the first bit line using the first complementary bit line, and
the second sense amplifier is configured to perform a read/write operation on a second memory cell connected to the second bit line using the first complementary bit line.

15. The volatile memory device of claim 12, wherein the memory cell array includes:
a plurality of word lines connected to the first mat, the second mat, and the third mat; and
a metal line connecting the second sense amplifier with the first complementary bit line, wherein the metal line is formed under the word lines.

16. The volatile memory device of claim 12, wherein the first edge region includes:
a third sense amplifier disposed in the second direction from the second sense amplifier; and
a third bit line disposed in the third direction from the third sense amplifier and connected to the third sense amplifier.

17. The volatile memory device of claim 16, wherein the first edge region includes a dummy bit line extending in the first direction from the third sense amplifier and connected to the third sense amplifier.

18. A volatile memory device comprising:
a first sense amplifier;
a second sense amplifier spaced apart from the first sense amplifier in a first direction;
a third sense amplifier spaced apart from the first sense amplifier in the first direction and spaced apart from the second sense amplifier in a second direction;
a first mat formed between the first sense amplifier and the second sense amplifier and including a first bit line connected to the first sense amplifier and a second bit line connected to the second sense amplifier;
a second mat formed between the first sense amplifier and the third sense amplifier and including a first complementary bit line connected to the first sense amplifier and a third bit line connected to the third sense amplifier;
a third mat spaced apart from the second sense amplifier in the first direction and including a second complementary bit line connected to the second sense amplifier;
a fourth mat spaced apart from the third sense amplifier in the first direction and including a third complementary bit line connected to the third sense amplifier;
a first word line connected to the first mat and the fourth mat; and
a second word line connected to the second mat and the third mat.

19. The volatile memory device of claim 18, wherein the first word line includes a first sub word line connected to the first and second bit lines of the first mat, a second sub word line connected to the third complementary bit line of the fourth mat, and a first metal line connecting the first sub word line and the second sub word line.

20. The volatile memory device of claim 19, wherein the first metal line is formed in a substrate under the first sub word line and the second sub word line.

* * * * *